(12) United States Patent  
Hanaoka

(10) Patent No.: US 12,603,621 B2  
(45) Date of Patent: Apr. 14, 2026

(54) RADIO-FREQUENCY CIRCUIT, RADIO-FREQUENCY MODULE, AND COMMUNICATION DEVICE

(71) Applicant: Murata Manufacturing Co., Ltd., Nagaokakyo (JP)

(72) Inventor: Kunitoshi Hanaoka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 324 days.

(21) Appl. No.: 18/409,802

(22) Filed: Jan. 11, 2024

(65) Prior Publication Data

US 2024/0146261 A1 May 2, 2024

Related U.S. Application Data

(63) Continuation of application No. PCT/JP2022/019819, filed on May 10, 2022.

(30) Foreign Application Priority Data

Aug. 11, 2021 (JP) ................................. 2021-131025

(51) Int. Cl.  
*H03F 3/24* (2006.01)

(52) U.S. Cl.  
CPC ......... *H03F 3/245* (2013.01); *H03F 2200/06* (2013.01); *H03F 2200/09* (2013.01); *H03F 2200/165* (2013.01); *H03F 2200/171* (2013.01); *H03F 2200/451* (2013.01)

(58) Field of Classification Search  
CPC ...................................................... H03F 3/245  
See application file for complete search history.

(56) References Cited

U.S. PATENT DOCUMENTS

| | | | | |
|---|---|---|---|---|
| 12,431,936 B2 * | 9/2025 | Ono | .......................... | H04B 1/40 |
| 2016/0285490 A1 * | 9/2016 | Hanaoka | .................. | H04B 1/16 |
| 2020/0169285 A1 * | 5/2020 | Arfaei Malekzadeh | ..................... | |
| | | | | H04B 1/0475 |
| 2021/0075371 A1 * | 3/2021 | Chatterjee | ................. | H03F 1/56 |
| 2021/0218373 A1 | 7/2021 | Jain et al. | | |
| 2022/0376662 A1 * | 11/2022 | Datta | ...................... | H03F 3/245 |

FOREIGN PATENT DOCUMENTS

JP       2017-017691 A       1/2017

OTHER PUBLICATIONS

International Search Report and Written Opinion mailed on Aug. 16, 2022, received for PCT Application PCT/JP2022/019819, filed on May 10, 2022, 8 pages including English Translation.

* cited by examiner

*Primary Examiner* — David Bilodeau  
(74) *Attorney, Agent, or Firm* — XSENSUS LLP

(57) ABSTRACT

In a first balun of a radio-frequency circuit, a first end of a first coil is connected to an amplifier, and a second end of the first coil is connected to a ground. In the first balun, a first end of a second coil is connected to a first switch, and a second end of the second coil is connected to a second switch. In a second balun, a first end of a third coil is connected to the first end of the second coil via the first switch, and a second end of the third coil is connected to the second end of the second coil via the second switch. In the second balun, a first end of a fourth coil is connected to a filter, and a second end of the fourth coil is connected to the ground.

20 Claims, 19 Drawing Sheets

FIG. 1

RADIO-FREQUENCY CIRCUIT, RADIO-FREQUENCY MODULE, AND COMMUNICATION DEVICE

CROSS-REFERENCE TO RELATED APPLICATIONS

This is a continuation application of PCT/JP2022/019819, filed on May 10, 2022, designating the United States of America, which is based on and claims priority to Japanese Patent Application No. JP 2021-131025 filed on Aug. 11, 2021. The entire contents of the above-identified applications, including the specifications, drawings and claims, are incorporated herein by reference in their entirety.

TECHNICAL FIELD

The present disclosure generally relates to a radio-frequency circuit, a radio-frequency module, and a communication device, and more particularly, to a radio-frequency circuit including an amplifier, a radio-frequency module including a radio-frequency circuit, and a communication device including a radio-frequency circuit.

BACKGROUND ART

Patent Document 1 discloses a radio-frequency circuit including a power amplifier, a filter, a switch that connects the power amplifier and the filter, and a switch that connects the filter and an antenna.

CITATION LIST

Patent Document

Patent Document 1: Japanese Unexamined Patent Application Publication No. 2017-17691

SUMMARY OF DISCLOSURE

Technical Problem

In a radio-frequency circuit, when electric power applied to a device such as a filter or a switch is large, signal distortion may occur in the device and the characteristics of the radio-frequency circuit may deteriorate.

The present disclosure describes a radio-frequency circuit, a radio-frequency module, and a communication device capable of suppressing deterioration of characteristics.

Solution to Problem

A radio-frequency circuit according to an aspect of the present disclosure includes a filter, an amplifier, a first switch, a second switch, a first balun, and a second balun. The amplifier has an input terminal and an output terminal. The amplifier is connected to the filter. The first balun has a first coil and a second coil. The second balun has a third coil and a fourth coil. In the first balun, a first end of the first coil is connected to a terminal of the input terminal and the output terminal of the amplifier that is connected to the filter, and a second end of the first coil is connected to a ground. In the first balun, a first end of the second coil is connected to the first switch, and a second end of the second coil is connected to the second switch. In the second balun, a first end of the third coil is connected to the first end of the second coil via the first switch, and a second end of the third coil is connected to the second end of the second coil via the second switch. In the second balun, a first end of the fourth coil is connected to the filter, and a second end of the fourth coil is connected to the ground.

A radio-frequency circuit according to an aspect of the present disclosure includes a first filter, a second filter, an amplifier, a first switch, a second switch, a first balun, and a second balun. The first filter has a first pass band. The second filter has a second pass band that is the same as the first pass band. The amplifier has an input terminal and an output terminal. The amplifier is connected to the first filter and the second filter. The first balun has a first coil and a second coil. The second balun has a third coil and a fourth coil. In the first balun, a first end of the first coil is connected to a terminal of the input terminal and the output terminal of the amplifier that is connected to the first filter and the second filter, and a second end of the first coil is connected to the ground. In the first balun, a first end of the second coil is connected to the first switch, and a second end of the second coil is connected to the second switch. In the second balun, a first end of the third coil is connected to the first end of the second coil via the first filter and the first switch, and a second end of the third coil is connected to the second end of the second coil via the second filter and the second switch. In the second balun, a first end of the fourth coil is connected to a signal path, and a second end of the fourth coil is connected to the ground.

A radio-frequency module according to an aspect of the present disclosure includes the radio-frequency circuit and a mounting substrate. The amplifier, the first switch, the second switch, the first balun, and the second balun of the radio-frequency circuit are arranged on the mounting substrate.

A communication device according to an aspect of the present disclosure includes the radio-frequency circuit and a signal processing circuit. The signal processing circuit is connected to the radio-frequency circuit.

In the radio-frequency circuit, the radio-frequency module, and the communication device according to the aspects of the present disclosure, it is possible to suppress deterioration of characteristics of the radio-frequency circuit.

BRIEF DESCRIPTION OF DRAWINGS

FIG. 1 is a circuit configuration diagram of a communication device including a radio-frequency circuit according to Embodiment 1.

DESCRIPTION OF EMBODIMENTS

Figure 2:
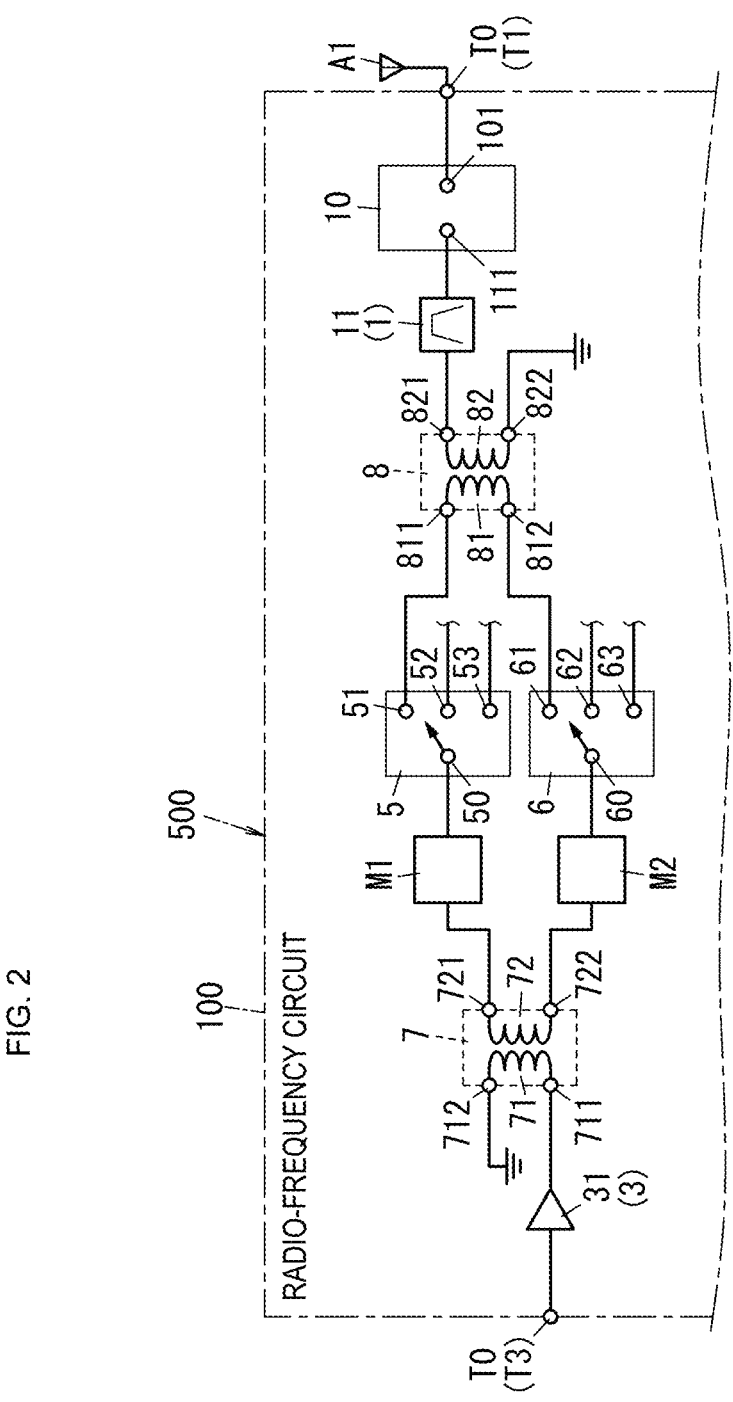
FIG. 2 is a circuit diagram of the above radio-frequency circuit.
Figure 3:
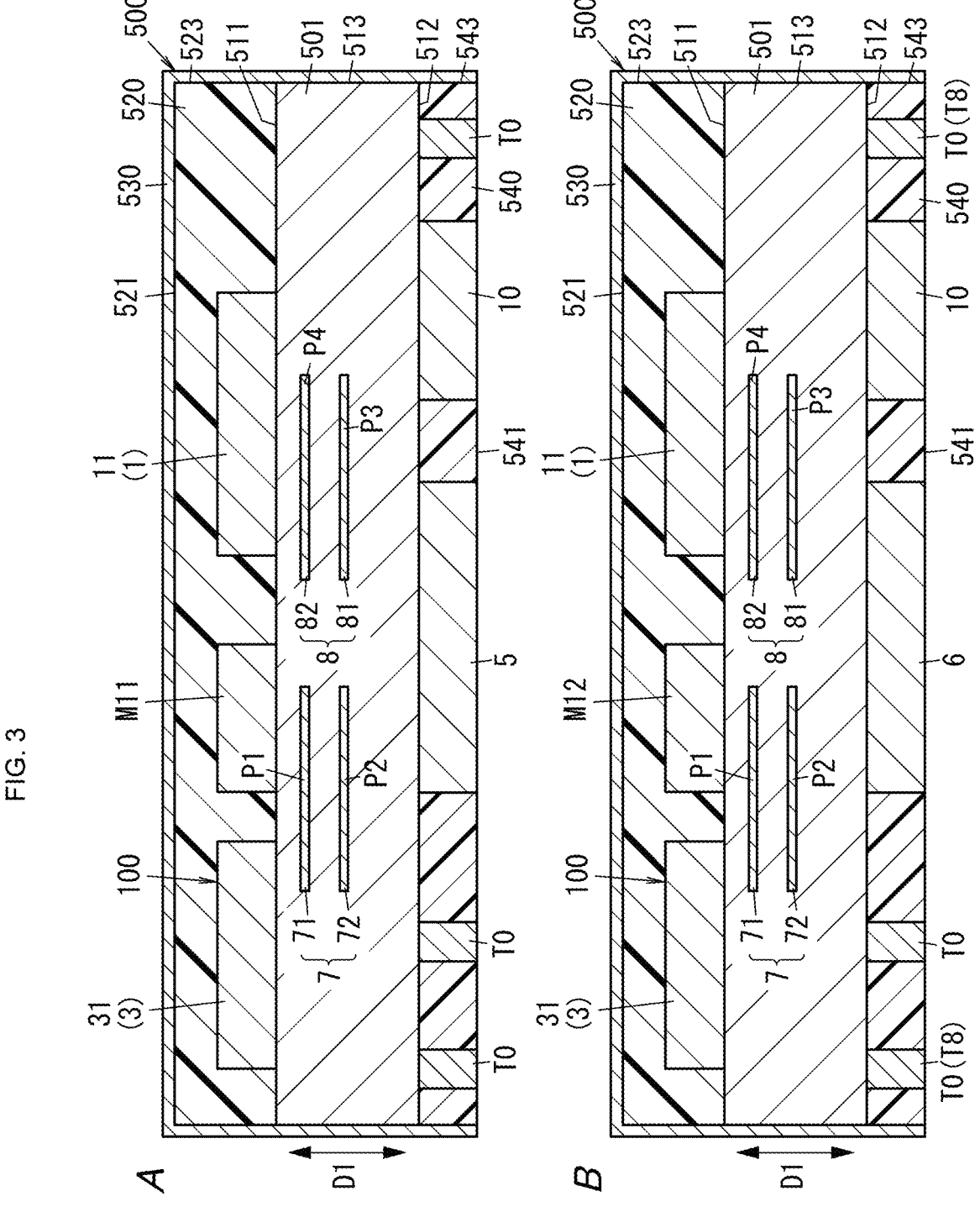
FIG. 3A is a cross-sectional view of a radio-frequency module including the above radio-frequency circuit.
FIG. 3B is another cross-sectional view of the radio-frequency module including the above radio-frequency circuit.

The drawings referred to in the following embodiments and the like each are a schematic drawing, and a ratio of a size or a thickness of each component in the drawing does not necessarily reflect an actual dimensional ratio.

Embodiment 1

Figure 1:
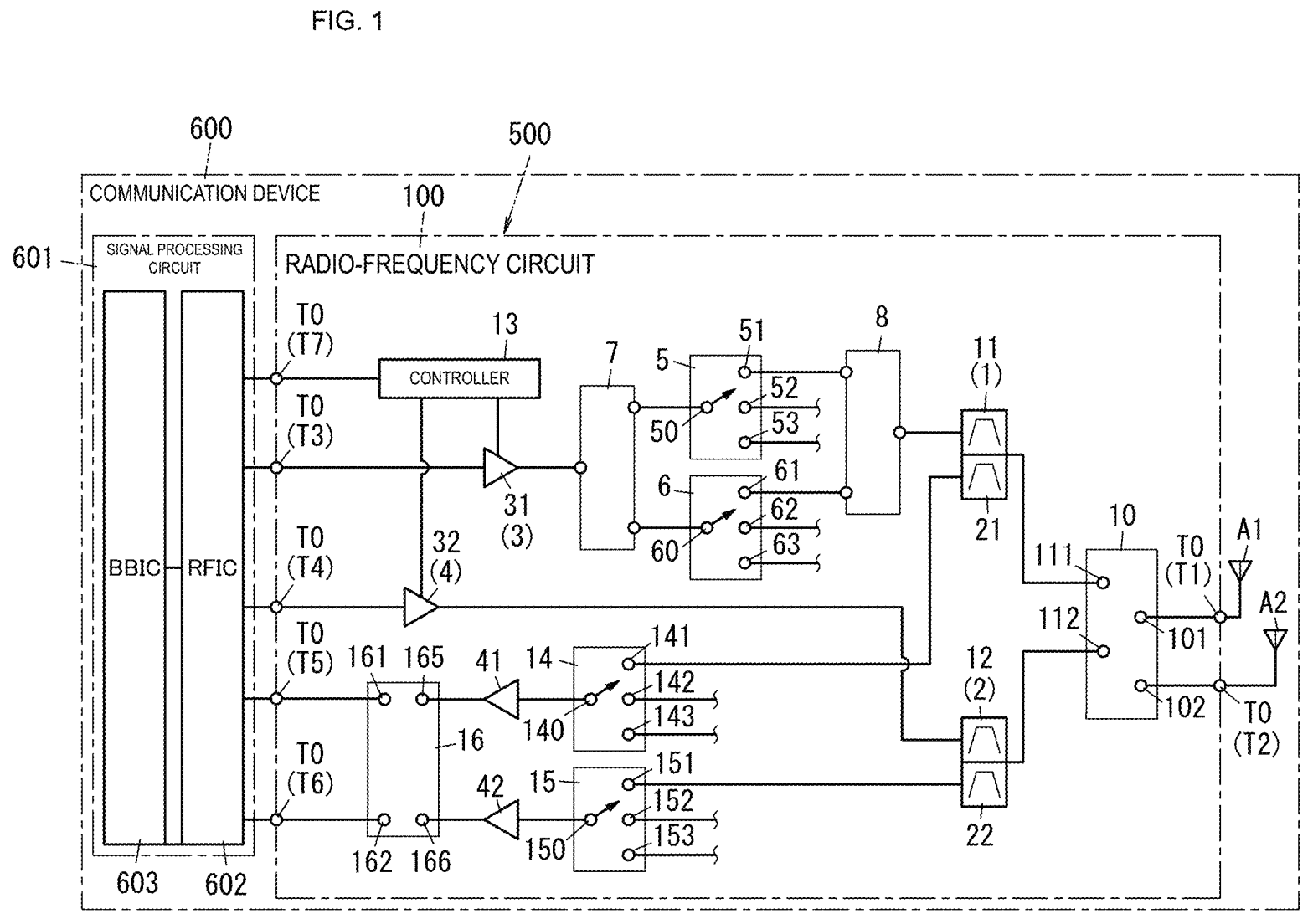

Hereinafter, a radio-frequency circuit 100, a radio-frequency module 500, and a communication device 600 according to Embodiment 1 will be described with reference to FIG. 1 to FIG. 4.

As illustrated in FIG. 1, the radio-frequency circuit 100 includes a filter 1 (transmission filter 11), an amplifier 3 (power amplifier 31), a first switch 5, a second switch 6, a first balun 7, and a second balun 8. The amplifier 3 has an input terminal and an output terminal. The amplifier 3 is connected to the filter 1. As illustrated in FIG. 2, the first balun 7 includes a first coil 71 and a second coil 72. As illustrated in FIG. 2, the second balun 8 includes a third coil 81 and a fourth coil 82. In the first balun 7, a first end 711 of the first coil 71 is connected to the output terminal of the amplifier 3, and a second end 712 of the first coil 71 is connected to the ground. In the first balun 7, a first end 721 of the second coil 72 is connected to the first switch 5, and a second end 722 of the second coil 72 is connected to the second switch 6. In the second balun 8, a first end 811 of the third coil 81 is connected to the first end 721 of the second coil 72 via the first switch 5, and a second end 812 of the third coil 81 is connected to the second end 722 of the second coil 72 via the second switch 6. In the second balun 8, a first end 821 of the fourth coil 82 is connected to filter 1, and a second end 822 of the fourth coil 82 is connected to the ground.

In addition, as illustrated in FIG. 1, the radio-frequency circuit 100 further includes a second filter 2 (transmission filter 12) different from the filter 1 (hereinafter also referred to as a first filter 1). The first filter has a first pass band. The second filter 2 has a second pass band different from the first pass band. In addition, the radio-frequency circuit 100 further includes a second amplifier 4 (power amplifier 32) different from the amplifier 3 (hereinafter also referred to as a first amplifier 3). The second amplifier 4 has an input terminal and an output terminal, and is connected to the second filter 2.

In addition, the radio-frequency circuit 100 further includes a plurality of (two in the illustrated example) reception filters 21 and 22 and a plurality of (two in the illustrated example) low noise amplifiers 41 and 42.

In addition, the radio-frequency circuit 100 further includes an antenna terminal T1 and a third switch 10. The third switch 10 is connected between the antenna terminal T1 and the second balun 8. In addition, the radio-frequency circuit 100 further includes a second antenna terminal T2 different from the antenna terminal T1. The third switch 10 is configured to be able to connect the first filter 1 and the first antenna terminal T1 and to be able to connect the second filter 2 and the second antenna terminal T2.

The first pass band of the first filter 1 (transmission filter 11) includes the frequency band of the first communication band. The second pass band of the second filter 2 (transmission filter 12) includes the frequency band of the second communication band in which simultaneous communication with the first communication band is possible. In addition, the pass band of the reception filter 21 includes the frequency band of the first communication band. The pass band of the reception filter 22 includes the frequency band of the second communication band. "Simultaneous communication is possible" means that at least one of simultaneous reception, simultaneous transmission, or simultaneous transmission and reception is possible. In the radio-frequency circuit 100, the combination of the first communication band and the second communication band is a combination in which any of simultaneous reception, simultaneous transmission, and simultaneous transmission and reception is possible in the radio-frequency circuit 100.

As illustrated in FIG. 1, the radio-frequency circuit 100 is used in, for example, the communication device 600. The communication device 600 is, for example, a mobile phone (for example, a smartphone), but is not limited thereto, and may be, for example, a wearable terminal (for example, a smart watch) or the like. The radio-frequency circuit 100 is a radio-frequency front end circuit compatible with, for example, the 4th generation mobile communication (4G) standard, the 5th generation mobile communication (5G) standard, or the like. The 4G standard is, for example, the 3GPP (registered trademark, Third Generation Partnership Project) LTE (registered trademark, Long Term Evolution) standard. The 5G standard is, for example, 5G NR (New Radio). The radio-frequency circuit 100 is, for example, a radio-frequency front end circuit capable of supporting carrier aggregation and dual connectivity. The combination of the first communication band and the second communication band in which simultaneous communication is possible is a combination of a plurality of frequency bands that partially overlaps each other or does not overlap each other at all, among the frequency bands of the communication band defined by the 3GPP LTE standard and the frequency bands of the communication band defined by the 5G NR standard. The frequency band is a downlink frequency band or an uplink frequency band. The downlink frequency band is a reception band. The uplink frequency band is a transmission band.

For example, the radio-frequency circuit 100 is configured to be able to amplify a transmission signal (radio-frequency signal) in a first frequency band input from a signal processing circuit 601 and output the amplified transmission signal to an antenna A1 (hereinafter also referred to as a first antenna A1). In addition, the radio-frequency circuit 100 is configured to be able to amplify a transmission signal (radio-frequency signal) in a second frequency band input from the signal processing circuit 601 and output the amplified transmission signal from an antenna A2 (hereinafter, also referred to as a second antenna A2). In addition, the radio-frequency circuit 100 is configured to be able to amplify a reception signal (radio-frequency signal) in the first frequency band input from the first antenna A1 and output the amplified reception signal to the signal processing circuit 601. In addition, the radio-frequency circuit 100 is configured to be able to amplify a reception signal (radio-frequency signal) in the second frequency band input from the second antenna A2 and output the amplified reception signal to the signal processing circuit 601. The signal processing circuit 601 is not a component of the radio-frequency circuit 100, but a component of the communication device 600 including the radio-frequency circuit 100. The radio-frequency circuit 100 is controlled by, for example, the signal processing circuit 601 included in the communication device 600. The communication device 600 includes the radio-frequency circuit 100 and the signal processing circuit 601. The communication device 600 further includes the first antenna A1 and the second antenna A2. The radio-frequency module 500 includes the radio-frequency circuit 100 and a mounting substrate 501 (see FIG. 3A, FIG. 3B, and FIG. 4).

Hereinafter, each of the radio-frequency circuit 100, the radio-frequency module 500, and the communication device 600 according to Embodiment 1 will be described in more detail.

(1) Radio-Frequency Circuit

(1.1) Circuit Configuration of Radio-Frequency Circuit

For example, as illustrated in FIG. 1, the radio-frequency circuit 100 includes a plurality of (for example, two) transmission filters 11 and 12, a plurality of (for example, two) power amplifiers 31 and 32, and a controller 13. In addition, the radio-frequency circuit 100 includes the plurality of (for example, two) reception filters 21 and 22 and the plurality of (for example, two) low noise amplifiers 41 and 42. In addition, the radio-frequency circuit 100 includes the first switch 5, the second switch 6, the third switch 10, a fourth switch 14, a fifth switch 15, a sixth switch 16, the first balun 7, and the second balun 8. In addition, the radio-frequency circuit 100 also includes a first matching circuit M1 (see FIG. 2) and a second matching circuit M2 (see FIG. 2). In addition, the radio-frequency circuit 100 further includes the controller 13. In addition, the radio-frequency circuit 100 further includes the first antenna terminal T1, the second antenna terminal T2, a first signal input terminal T3, a second signal input terminal T4, a first signal output terminal 15, a second signal output terminal T6, and a control terminal T7.

(1.1.1) Transmission Filter

Hereinafter, for convenience of description, the transmission filter 11 is also referred to as the first transmission filter 11 and the transmission filter 12 is also referred to as the second transmission filter 12. In the radio-frequency circuit 100 according to Embodiment 1, the first transmission filter 11 constitutes the first filter 1 described above, and the second transmission filter 12 constitutes the second filter 2 described above. Each of the plurality of transmission filters 11 and 12 is, for example, an acoustic wave filter. The acoustic wave filter is, for example, a ladder filter, and includes a plurality of (for example, four) series arm resonators and a plurality of (for example, three) parallel arm resonators. In the acoustic wave filter, each of the plurality of series arm resonators and the plurality of parallel arm resonators is formed by an acoustic wave resonator. The acoustic wave filter is, for example, a surface acoustic wave filter using a surface acoustic wave. In the surface acoustic wave filter, each of the plurality of series arm resonators and the plurality of parallel arm resonators is, for example, a surface acoustic wave (SAW) resonator including an inter-digital transducer (IDT) electrode.

The first transmission filter 11 is a filter having a pass band including the uplink frequency band of the first communication band. The second transmission filter 12 is a filter having a pass band including the uplink frequency band of the second communication band. The first communication band is, for example, Band 25 of the 3GPP LTE standard. The second communication band is, for example, Band 66 of the 3GPP LTE standard.

(1.1.2) Power Amplifier

Hereinafter, for convenience of description, the power amplifier 31 is referred to as the first power amplifier 31, and the power amplifier 32 is referred to as the second power amplifier 32. In the radio-frequency circuit 100 according to Embodiment 1, the first power amplifier 31 constitutes the first amplifier 3 described above, and the second power amplifier 32 constitutes the second amplifier 4 described above.

The first power amplifier 31 has an input terminal and an output terminal. The first power amplifier 31 amplifies a transmission signal (first transmission signal) in the first frequency band input to the input terminal and outputs the amplified transmission signal from the output terminal. The first frequency band includes, for example, the frequency band of the first communication band and does not include the frequency band of the second communication band. More specifically, the first frequency band includes, for example, the uplink frequency band of Band 25 of the 3GPP LTE standard, and does not include the uplink frequency band of Band 66 of the 3GPP LTE standard. In addition, the first frequency band further includes, for example, the uplink frequency band of Band 3 of the 3GPP LTE standard and the uplink frequency band of Band 34 of the 3GPP LTE standard.

The input terminal of the first power amplifier 31 is connected to the first signal input terminal T3. The input terminal of the first power amplifier 31 is connected to the signal processing circuit 601 via the first signal input terminal T3. The first signal input terminal T3 is a terminal for inputting a radio-frequency signal (transmission signal) from an external circuit (for example, the signal processing circuit 601) to the radio-frequency circuit 100. The output terminal of the first power amplifier 31 is connected to the first balun 7. Therefore, the output terminal of the first power amplifier 31 is connected to the first switch 5 and the second switch 6 via the first balun 7. In the radio-frequency circuit 100, the first switch 5 and the second switch 6 are connected to the second balun 8, and the second balun 8 is connected to the first transmission filter 11.

The second power amplifier 32 has an input terminal and an output terminal. The second power amplifier 32 amplifies the transmission signal (second transmission signal) in the second frequency band input to the input terminal and outputs the amplified transmission signal from the output terminal. The second frequency band includes, for example, the frequency band of the second communication band and does not include the frequency band of the first communication band.

The input terminal of the second power amplifier 32 is connected to the second signal input terminal T4. The input terminal of the second power amplifier 32 is connected to the signal processing circuit 601 via the second signal input terminal T4. The second signal input terminal T4 is a terminal for inputting a radio-frequency signal (transmission signal) from an external circuit (for example, the signal processing circuit 601) to the radio-frequency circuit 100. The output terminal of the second power amplifier 32 is connected to the transmission filter 12 (second filter 2).

(1.1.3) Controller

The controller 13 is connected to the control terminal T7. The control terminal T7 is connected to the signal processing circuit 601, for example. The controller 13 controls the first power amplifier 31 based on the control signal from the signal processing circuit 601. Further, the controller 13 also controls the second power amplifier 32 based on the control signal from the signal processing circuit 601.

(1.1.4) Reception Filter

Hereinafter, for convenience of description, the reception filter 21 is also referred to as the first reception filter 21 and the reception filter 22 is also referred to as the second reception filter 22. Each of the plurality of reception filters 21 and 22 is, for example, an acoustic wave filter. The acoustic wave filter is, for example, a ladder filter, and includes a plurality of (for example, four) series arm resonators and a plurality of (for example, three) parallel arm resonators. In the acoustic wave filter, each of the plurality of series arm resonators and the plurality of parallel arm resonators is formed by an acoustic wave resonator. The acoustic wave filter is, for example, a surface acoustic wave filter using a surface acoustic wave. In the surface acoustic wave filter, each of the plurality of series arm resonators and the plurality of parallel arm resonators is, for example, a SAW resonator including an IDT electrode.

The first reception filter 21 is a filter having a pass band including the downlink frequency band of the first communication band. The second reception filter 22 is a filter having a pass band including the downlink frequency band of the second communication band. The first communication band is, for example, Band 25 of the 3GPP LTE standard. The second communication band is, for example, Band 66 of the 3GPP LTE standard.

(1.1.5) Low Noise Amplifier

Hereinafter, for convenience of description, the low noise amplifier 41 is referred to as the first low noise amplifier 41, and the low noise amplifier 42 is referred to as the second low noise amplifier 42.

The first low noise amplifier 41 has an input terminal and an output terminal. The first low noise amplifier 41 amplifies a reception signal in a third frequency band input to the input terminal and outputs the amplified reception signal from the output terminal. The third frequency band includes, for example, the frequency band of the first communication band and does not include the frequency band of the second communication band. More specifically, the third frequency band includes, for example, the downlink frequency band of Band 25 of the 3GPP LTE standard and does not include the downlink frequency band of Band 66 of the 3GPP LTE standard. In addition, the third frequency band further includes, for example, the downlink frequency band of Band 70 of the 3GPP LTE standard.

The input terminal of the first low noise amplifier 41 is connected to a common terminal 140 of the fourth switch 14, and is connected to the first reception filter 21 via the fourth switch 14. The output terminal of the first low noise amplifier 41 is connected to the sixth switch 16 and connected to the first signal output terminal T5 via the sixth switch 16. The first signal output terminal T5 is a terminal for outputting the radio-frequency signal (reception signal) from the first low noise amplifier 41 to an external circuit (for example, the signal processing circuit 601). Therefore, the first low noise amplifier 41 is connected to the signal processing circuit 601 via the first signal output terminal T5.

The second low noise amplifier 42 has an input terminal and an output terminal. The second low noise amplifier 42 amplifies the reception signal in the fourth frequency band input to the input terminal and outputs the amplified reception signal from the output terminal. The fourth frequency band includes, for example, the frequency band of the second communication band and does not include the frequency band of the first communication band. More specifically, the fourth frequency band includes, for example, the downlink frequency band of Band 66 of the 3GPP LTE standard and does not include the downlink frequency band of Band 25 of the 3GPP LTE standard.

The input terminal of the second low noise amplifier 42 is connected to a common terminal 150 of the fifth switch 15, and is connected to the second reception filter 22 via the fifth switch 15. The output terminal of the second low noise amplifier 42 is connected to the sixth switch 16 and is connected to the second signal output terminal T6 via the sixth switch 16. The second signal output terminal T6 is a terminal for outputting the radio-frequency signal (reception signal) from the second low noise amplifier 42 to an external circuit (for example, the signal processing circuit 601). Therefore, the second low noise amplifier 42 is connected to the signal processing circuit 601 via the second signal output terminal T6.

(1.1.6) First Switch

The first switch 5 includes a common terminal 50 and a plurality of (three in the illustrated example) selection terminals 51 to 53. The common terminal 50 is connected to the first end 721 of the second coil 72 in the first balun 7 (see FIG. 2). The selection terminal 51 is connected to the first end 811 of the third coil 81 in the second balun 8 (see FIG. 2). The first switch 5 is, for example, a switch capable of connecting at least one or more of the three selection terminals 51 to 53 to the common terminal 50. Here, the first switch 5 is, for example, a switch capable of one-to-one and one-to-many connections.

The first switch 5 is controlled by, for example, the signal processing circuit 601. The first switch 5 switches the connection state between the common terminal 50 and the three selection terminals 51 to 53 in accordance with a control signal from an RF signal processing circuit 602 of the signal processing circuit 601. The first switch 5 is, for example, a switch integrated circuit (IC).

(1.1.7) Second Switch

The second switch 6 includes a common terminal 60 and a plurality of (three in the illustrated example) selection terminals 61 to 63. The common terminal 60 is connected to the second end 722 of the second coil 72 in the first balun 7 (see FIG. 2). The selection terminal 61 is connected to the second end 812 of the third coil 81 in the second balun 8 (see FIG. 2). The second switch 6 is, for example, a switch capable of connecting at least one or more of the three selection terminals 61 to 63 to the common terminal 60. Here, the second switch 6 is, for example, a switch capable of one-to-one and one-to-many connections.

The second switch 6 is controlled by, for example, the signal processing circuit 601. The second switch 6 switches the connection state between the common terminal 60 and the three selection terminals 61 to 63 in accordance with a control signal from the RF signal processing circuit 602 of the signal processing circuit 601. The second switch 6 is, for example, a switch IC.

(1.1.8) Third Switch

The third switch 10 includes two first terminals 101 and 102 and a plurality of (two in the illustrated example) second terminals 111 and 112. The first terminal 101 is connected to the first antenna terminal T1. The first terminal 102 is connected to the second antenna terminal T2. The second terminal 111 is connected to the first transmission filter 11 and the first reception filter 21. More specifically, the second terminal 111 is connected to a connection point between the output terminal of the first transmission filter 11 and the input terminal of the first reception filter 21. The second terminal 112 is connected to the second transmission filter 12 and the second reception filter 22. More specifically, the second terminal 112 is connected to a connection point between the output terminal of the second transmission filter 12 and the input terminal of the second reception filter 22. In the third switch 10, the first terminal 101 and the second terminal 111 can be connected to each other, and the first terminal 102 and the second terminal 112 can be connected to each other.

The third switch 10 is controlled by, for example, the signal processing circuit 601. The third switch 10 switches the connection state between the first terminals 101 and 102 and the second terminals 111 and 112 in accordance with a control signal from the RF signal processing circuit 602 of the signal processing circuit 601. The third switch 10 is, for example, a switch IC.

(1.1.9) Fourth Switch

The fourth switch 14 includes a common terminal 140 and a plurality of (three in the illustrated example) selection terminals 141 to 143. The common terminal 140 is connected to the input terminal of the first low noise amplifier 41. The selection terminal 141 is connected to the output terminal of the first reception filter 21. The fourth switch 14 is, for example, a switch capable of connecting the common terminal 140 and at least one or more of the plurality of selection terminals 141 to 143. Here, the fourth switch 14 is, for example, a switch capable of one-to-one and one-to-many connections.

The fourth switch 14 is controlled by, for example, the signal processing circuit 601. The fourth switch 14 switches the connection state between the common terminal 140 and the plurality of selection terminals 141 to 143 in accordance with a control signal from the RF signal processing circuit 602 of the signal processing circuit 601. The fourth switch 14 is, for example, a switch IC.

(1.1.10) Fifth Switch

The fifth switch 15 includes the common terminal 150 and a plurality of (three in the illustrated example) selection terminals 151 to 153. The common terminal 150 is connected to the input terminal of the second low noise amplifier 42. The selection terminal 151 is connected to the output terminal of the second reception filter 22. The fifth switch 15 is, for example, a switch capable of connecting the common terminal 150 and at least one or more of the plurality of selection terminals 151 to 153. Here, the fifth switch 15 is, for example, a switch capable of one-to-one and one-to-many connections.

The fifth switch 15 is controlled by, for example, the signal processing circuit 601. The fifth switch 15 switches the connection state between the common terminal 150 and the plurality of selection terminals 151 to 153 in accordance with a control signal from the RF signal processing circuit 602 of the signal processing circuit 601. The fifth switch 15 is, for example, a switch IC.

(1.1.11) Sixth Switch

The sixth switch 16 includes two first terminals 161 and 162 and a plurality of (two in the illustrated example) second terminals 165 and 166. The first terminal 161 is connected to the first signal output terminal T5. The first terminal 162 is connected to the second signal output terminal T6. The second terminal 165 is connected to the output terminal of the first low noise amplifier 41. The second terminal 166 is connected to the output terminal of the second low noise amplifier 42.

In the sixth switch 16, the first terminal 161 and the second terminal 165 can be connected to each other, and the first terminal 162 and the second terminal 166 can be connected to each other.

The sixth switch 16 is controlled by, for example, the signal processing circuit 601. The sixth switch 16 switches the connection state between the first terminals 161 and 162 and the second terminals 165 and 166 in accordance with a control signal from the RF signal processing circuit 602 of the signal processing circuit 601. The sixth switch 16 is, for example, a switch IC.

(1.1.12) First Balun

As illustrated in FIG. 2, the first balun 7 includes the first coil 71 and the second coil 72. The first coil 71 and the second coil 72 face each other. In the first balun 7, the first end 711 of the first coil 71 is connected to the amplifier 3, and the second end 712 of the first coil 71 is connected to the ground. In the first balun 7, the first end 721 of the second coil 72 is connected to the first switch 5, and the second end 722 of the second coil 72 is connected to the second switch 6.

The first balun 7 converts a radio-frequency signal (unbalanced signal) input to the first end 711 (unbalanced terminal) of the first coil 71 into a pair of radio-frequency signals (first and second radio-frequency signals), outputs the first radio-frequency signal from the first end 721 (first balanced terminal) of the second coil 72, and outputs the second radio-frequency signal from the second end 722 (second balanced terminal) of the second coil 72. The first radio-frequency signal and the second radio-frequency signal have opposite phases to each other. In the first balun 7, the first end 711 of the first coil 71 constitutes an unbalanced terminal, but the configuration is not limited thereto. For example, the first balun 7 may have an unbalanced terminal connected to the first end 711. In addition, in the first balun 7, the first end 721 and the second end 722 of the second coil 72 constitute a pair of balanced terminals, but the configuration is not limited thereto. For example, the first balun 7 may have a pair of balanced terminals connected to the first end 721 and the second end 722 of the second coil 72 on a one-to-one basis.

(1.1.13) Second Balun

As illustrated in FIG. 2, the second balun 8 includes the third coil 81 and the fourth coil 82. The third coil 81 and the fourth coil 82 face each other. In the second balun 8, the first end 811 of the third coil 81 is connected to the first end 721 of the second coil 72 via the first switch 5, and the second end 812 of the third coil 81 is connected to the first end 721 of the second coil 72 via the second switch 6. In the second balun 8, the first end 821 of the fourth coil 82 is connected to the filter 1, and the second end 822 of the fourth coil 82 is connected to the ground.

The second balun 8 converts a pair of radio-frequency signals (a first radio-frequency signal and a second radio-frequency signal) input to each of the first end 811 and the second end 812 of the third coil 81 into an unbalanced radio-frequency signal, and outputs the unbalanced radio-frequency signal from the first end 821 of the fourth coil 82. In the second balun 8, the first end 811 and the second end 812 of the third coil 81 constitute a pair of balanced terminals, but the configuration is not limited thereto. For example, the second balun 8 may have a pair of balanced terminals connected to the first end 811 and the second end 812 of the third coil 81 on a one-to-one basis. In addition, in the second balun 8, the first end 821 of the fourth coil 82 constitutes an unbalanced terminal, but the configuration is not limited thereto. For example, the second balun 8 may have an unbalanced terminal connected to the first end 821.

(1.1.14) First Matching Circuit and Second Matching Circuit

The first matching circuit M1 is a matching circuit for impedance matching. The first matching circuit M1 is connected between the second coil 72 of the first balun 7 and the first switch 5. More specifically, the first matching circuit M1 is connected between the first end 721 of the second coil 72 of the first balun 7 and the common terminal 50 of the first switch 5. The first matching circuit M1 may include at least one of an inductor, a capacitor, or a resistor. The second matching circuit M2 is a matching circuit for impedance matching. The second matching circuit M2 is connected between the second coil 72 of the first balun 7 and the second switch 6. More specifically, the second matching circuit M2 is connected between the second end 722 of the second coil 72 of the first balun 7 and the common terminal 60 of the second switch 6.

(1.2) Summary

The radio-frequency circuit 100 according to Embodiment 1 includes the filter 1 (transmission filter 11), the amplifier 3 (power amplifier 31), the first switch 5, the second switch 6, the first balun 7, and the second balun 8. The amplifier 3 has the input terminal and the output terminal. The amplifier 3 is connected to the filter 1. The first balun 7 includes the first coil 71 and the second coil 72. The second balun 8 includes the third coil 81 and the fourth coil

82. In the first balun 7, the first end 711 of the first coil 71 is connected to the output terminal of the amplifier 3, and the second end 712 of the first coil 71 is connected to the ground. In the first balun 7, the first end 721 of the second coil 72 is connected to the first switch 5, and the second end 722 of the second coil 72 is connected to the second switch 6. In the second balun 8, the first end 811 of the third coil 81 is connected to the first end 721 of the second coil 72 via the first switch 5, and the second end 812 of the third coil 81 is connected to the second end 722 of the second coil 72 via the second switch 6. In the second balun 8, the first end 821 of the fourth coil 82 is connected to the filter 1, and the second end 822 of the fourth coil 82 is connected to the ground.

The radio-frequency circuit 100 according to Embodiment 1 can suppress deterioration of the characteristics of the radio-frequency circuit 100. More specifically, in the radio-frequency circuit 100, since the switches (the first switch 5 and the second switch 6) which are nonlinear devices are connected between the first balun 7 and the second balun 8, it is possible to reduce power applied to the switches (the first switch 5 and the second switch 6). As such, the radio-frequency circuit 100 can reduce the signal distortion of the radio-frequency signal in the switches (the first switch 5 and the second switch 6), and can suppress the deterioration of the characteristics of the radio-frequency circuit 100. In addition, in the radio-frequency circuit 100 according to Embodiment 1, it is possible to reduce the distortion of the radio-frequency signal by the reduction of the power applied to each of the switches (the first switch 5 and the second switch 6) and the filter 1 and the suppression effect of the temperature rise of each of the switches (the first switch 5 and the second switch 6) and the filter 1 due to the reduction of the power.

In addition, in the radio-frequency circuit 100 according to Embodiment 1, the amplifier 3 is the power amplifier 31 that amplifies the transmission signal. The first balun 7 is connected to the output terminal of the amplifier 3. Therefore, the radio-frequency circuit 100 according to Embodiment 1 can suppress the signal distortion of a radio-frequency signal (transmission signal) in the switches (the first switch 5 and the second switch 6).

In addition, in the radio-frequency circuit 100 according to Embodiment 1 further includes the second filter 2 that is different from the first filter 1, and the second amplifier 4 that is different from the first amplifier 3 serving as the amplifier 3, has the input terminal and the output terminal, and is connected to the second filter 2. The first filter 1 has the first pass band. The second filter 2 has the second pass band different from the first pass band.

For example, the radio-frequency circuit 100 according to Embodiment 1 can reduce the magnitude of intermodulation distortion (IMD) that occurs when two uplink carrier aggregation is performed using the first amplifier 3 (first power amplifier 31) and the second amplifier 4 (second power amplifier 32).

(2) Radio-Frequency Module

Figure 4:
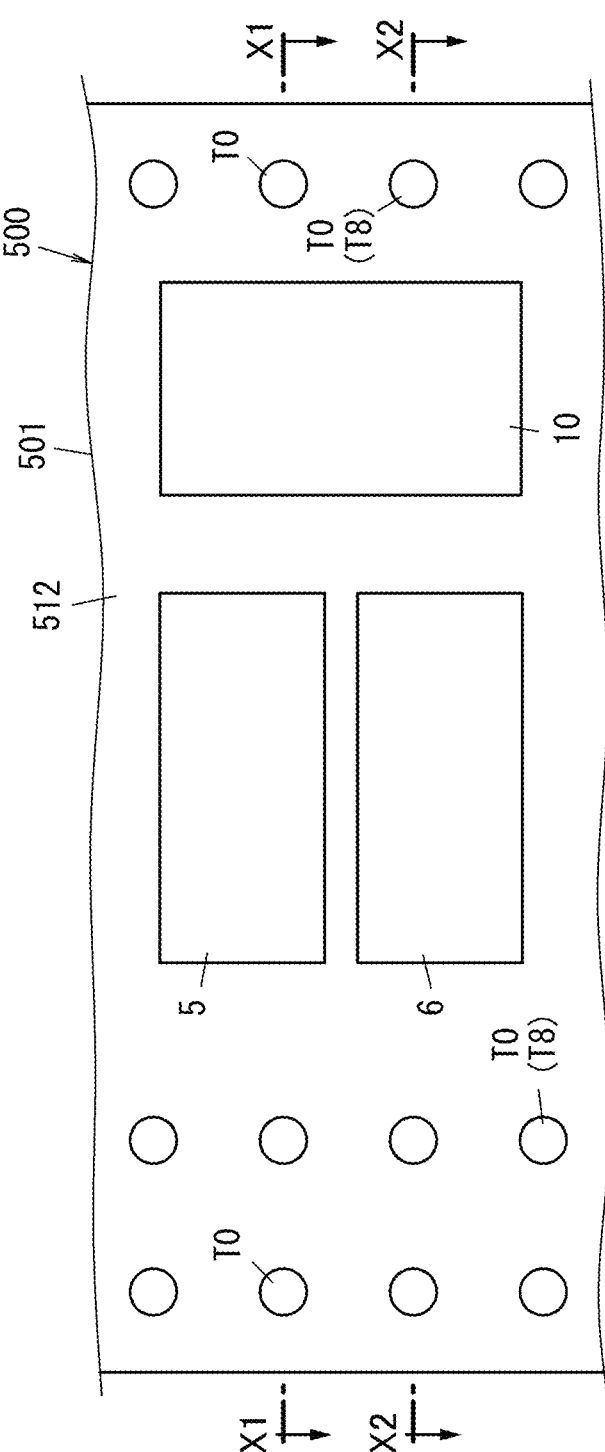
FIG. 4 is a bottom view of the radio-frequency module including the above radio-frequency circuit.

Hereinafter, the radio-frequency module 500 including the radio-frequency circuit 100 will be described in more detail with reference to FIG. 3A, FIG. 3B, and FIG. 4. Note that FIG. 3A is a cross-sectional view corresponding to a cross section taken along a line X1-X1 in FIG. 4. In addition, FIG. 3B is a cross-sectional view corresponding to a cross section taken along a line X2-X2 in FIG. 4.

(2.1) Configuration of Radio-Frequency Module

The radio-frequency module 500 includes the radio-frequency circuit 100 and the mounting substrate 501. The mounting substrate 501 has a first main surface 511 and a second main surface 512 facing each other. The amplifier 3 is arranged on the first main surface 511 of the mounting substrate 501. The first switch 5 and the second switch 6 are arranged on the second main surface 512 of the mounting substrate 501. The first balun 7 and the second balun 8 are arranged in the mounting substrate 501. In addition, in the radio-frequency module 500, a plurality of external connection terminals TO is arranged on the second main surface 512 of the mounting substrate 501. In addition, the radio-frequency module 500 further includes a resin layer 520 (hereinafter also referred to as a first resin layer 520) and a metal electrode layer 530. In addition, the radio-frequency module 500 further includes a second resin layer 540.

(2.1.1) Mounting Substrate

As illustrated in FIG. 3A and FIG. 3B, the mounting substrate 501 has the first main surface 511 and the second main surface 512 facing each other in a thickness direction D1 of the mounting substrate 501. The mounting substrate 501 includes a plurality of dielectric layers, a plurality of conductive layers, and a plurality of via conductors. In the mounting substrate 501, a plurality of dielectric layers and a plurality of conductive layers are alternately laminated one by one in the thickness direction D1 of the mounting substrate 501. In other words, the mounting substrate 501 is a multilayer substrate including a plurality of dielectric layers and a plurality of conductive layers. The plurality of conductive layers is formed in a predetermined pattern determined for each layer. Each of the plurality of conductive layers includes one or more conductor portions. The mounting substrate 501 is a low temperature co-fired ceramics (LTCC) substrate, for example. Based on the mounting substrate 501 being the LTCC substrate, the material of each dielectric layer is, for example, ceramics containing alumina and glass. In addition, the material of each conductive layer is, for example, copper. The material of each conductive layer is not limited to copper, and may be silver, for example. The mounting substrate 501 is not limited to the LTCC substrate and may be, for example, a printed wiring board, a high temperature co-fired ceramics (HTCC) substrate, or a resin multilayer substrate.

The first main surface 511 and the second main surface 512 of the mounting substrate 501 are away from each other in the thickness direction D1 of the mounting substrate 501, and intersect the thickness direction D1 of the mounting substrate 501. The first main surface 511 of the mounting substrate 501 includes a surface orthogonal to the thickness direction D1 of the mounting substrate 501 and a surface not orthogonal to the thickness direction D1. In addition, the second main surface 512 of the mounting substrate 501 is, for example, orthogonal to the thickness direction D1 of the mounting substrate 501, but may include, for example, a side surface of a conductor portion or the like as a surface not orthogonal to the thickness direction D1.

One of the plurality of conductive layers includes a ground layer. The ground layer is a circuit ground of the radio-frequency module 500. The ground layer is connected to a ground terminal T8 through via conductors and the like. Further, the ground layer is electrically connected to the metal electrode layer 530. The ground layer is in contact with the metal electrode layer 530.

(2.1.2) Electronic Component

In the radio-frequency module 500, a plurality of electronic components is mounted on the first main surface 511 of the mounting substrate 501, and a plurality of electronic components is mounted on the second main surface 512 of the mounting substrate 501. "An electronic component is mounted on the first main surface 511 of the mounting substrate 501" includes that the electronic component is arranged on (mechanically connected to) the first main surface 511 of the mounting substrate 501 and that the electronic component is electrically connected to (an appropriate conductor portion of) the mounting substrate 501. "An electronic component is mounted on the second main surface 512 of the mounting substrate 501" includes that the electronic component is arranged on (mechanically connected to) the second main surface 512 of the mounting substrate 501 and that the electronic component is electrically connected to (an appropriate conductor portion of) the mounting substrate 501. The plurality of electronic components mounted on the first main surface 511 of the mounting substrate 501 includes the first power amplifier 31 (first amplifier 3), the second power amplifier 32 (second amplifier 4), the first transmission filter 11 (first filter 1), the second transmission filter 12 (second filter 2), a plurality of circuit elements M11 of the first matching circuit M1, and a plurality of circuit elements M12 of the second matching circuit M2. The plurality of electronic components mounted on the second main surface 512 of the mounting substrate 501 includes the first low noise amplifier 41, the second low noise amplifier 42, the first switch 5, the second switch 6, the third switch 10, the fourth switch 14, the fifth switch 15, and the sixth switch 16. The first power amplifier 31 and the second power amplifier 32 are, for example, GaAs-based chips. Each of the first low noise amplifier 41, the second low noise amplifier 42, the first switch 5, the second switch 6, the third switch 10, the fourth switch 14, the fifth switch 15, and the sixth switch 16 is a Si-based chip. The plurality of circuit elements M11 of the first matching circuit M1 includes, for example, a chip inductor, a chip capacitor, and a chip resistor. The plurality of circuit elements M12 of the second matching circuit M2 includes, for example, a chip inductor, a chip capacitor, and a chip resistor. The circuit configuration of the first matching circuit M1 and the circuit configuration of the second matching circuit M2 are the same. The first matching circuit M1 is not limited to the configuration including the plurality of circuit elements M11. The second matching circuit M2 is not limited to the configuration including the plurality of circuit elements M12. In addition, each of the first matching circuit M1 and the second matching circuit M2 may be an integrated passive device (IPD).

In plan view from the thickness direction D1 of the mounting substrate 501, the outer edge of each of the plurality of electronic components mounted on the first main surface 511 of the mounting substrate 501 has a quadrangular shape. Further, in plan view from the thickness direction D1 of the mounting substrate 501, the outer edge of each of the plurality of electronic components mounted on the second main surface 512 of the mounting substrate 501 has a quadrangular shape.

(2.1.3) First Balun and Second Balun

The first balun 7 and the second balun 8 in the radio-frequency circuit 100 are built in the mounting substrate 501. The first coil 71 of the first balun 7 includes a first conductor pattern portion P1 intersecting (for example, orthogonal to) the thickness direction D1 of the mounting substrate 501. The second coil 72 of the first balun 7 includes a second conductor pattern portion P2 that intersects (for example, orthogonal to) the thickness direction D1 of the mounting substrate 501 and faces the first conductor pattern portion P1 in the thickness direction D1 of the mounting substrate 501. In plan view from the thickness direction D1 of the mounting substrate 501, the first coil 71 and the second coil 72 of the first balun 7 at least partially overlap each other. Each of the first conductor pattern portion P1 and the second conductor pattern portion P2 has, for example, a spiral shape. The third coil 81 of the second balun 8 includes a third conductor pattern portion P3 intersecting (for example, orthogonal to) the thickness direction D1 of the mounting substrate 501. The fourth coil 82 of the second balun 8 includes a fourth conductor pattern portion P4 that intersects (for example, orthogonal to) the thickness direction D1 of the mounting substrate 501 and faces the third conductor pattern portion P3 in the thickness direction D1 of the mounting substrate 501. The third coil 81 and the fourth coil 82 of the second balun 8 at least partially overlap each other in plan view from the thickness direction D1 of the mounting substrate 501. Each of the third conductor pattern portion P3 and the fourth conductor pattern portion P4 has, for example, a spiral shape.

(2.1.4) External Connection Terminal

The plurality of external connection terminals TO is arranged on the second main surface 512 of the mounting substrate 501. "The external connection terminal TO is arranged on the second main surface 512 of the mounting substrate 501" includes that the external connection terminal TO is mechanically connected to the second main surface 512 of the mounting substrate 501 and that the external connection terminal TO is electrically connected to (an appropriate conductor portion of) the mounting substrate 501. The material of the plurality of external connection terminals TO is, for example, a metal (e.g., copper, a copper alloy, etc.). Each of the plurality of external connection terminals TO is a columnar electrode. The columnar electrode is, for example, a cylindrical electrode. The plurality of external connection terminals TO is bonded to the conductor portion of the mounting substrate 501 by, for example, solder, but not limited thereto and, for example, may be bonded using a conductive adhesive (for example, conductive paste) or may be directly bonded. Each of the plurality of external connection terminals TO has a circular shape in plan view from the thickness direction D1 of the mounting substrate 501.

The plurality of external connection terminals TO includes the first antenna terminal T1, the second antenna terminal T2, the first signal input terminal T3, the second signal input terminal T4, the first signal output terminal T5, the second signal output terminal T6, the control terminal T7, and the plurality of ground terminals T8 (see FIG. 1 and FIG. 3B). The plurality of ground terminals T8 is a terminal that is electrically connected to the ground electrode of the above-described circuit board included in the communication device 600 and is supplied with a ground potential.

(2.1.5) First Resin Layer

As illustrated in FIG. 3A and FIG. 3B, the first resin layer 520 is arranged on the first main surface 511 of the mounting substrate 501. The first resin layer 520 covers the plurality of electronic components mounted on the first main surface 511 of the mounting substrate 501. The first resin layer 520 includes a resin (for example, an epoxy resin). The first resin layer 520 may contain a filler in addition to the resin.

(2.1.6) Second Resin Layer

As illustrated in FIG. 3A and FIG. 3B, the second resin layer 540 is arranged on the second main surface 512 of the mounting substrate 501. The second resin layer 540 covers the outer circumferential surface of each of the plurality of electronic components mounted on the second main surface 512 of the mounting substrate 501 and the outer circumferential surface of each of the plurality of external connection terminals TO. The outer circumferential surface of each of the plurality of electronic components includes four side surfaces of the electronic component. The second resin layer 540 does not cover a main surface of each of the plurality of electronic components on a side opposite to the mounting substrate 501 side. The second resin layer 540 includes a resin (for example, an epoxy resin). The second resin layer 540 may contain a filler in addition to the resin. The material of the second resin layer 540 may be the same material as the material of the first resin layer 520 or may be a different material.

(2.1.7) Metal Electrode Layer

As illustrated in FIG. 3A and FIG. 3B, the metal electrode layer 530 covers the first resin layer 520. The metal electrode layer 530 is connected to the ground terminal T8 of the mounting substrate 501. The metal electrode layer 530 has electric conductivity. In the radio-frequency module 500, the metal electrode layer 530 is a shield layer provided for the purpose of electromagnetic shielding between the inside and the outside of the radio-frequency module 500. The metal electrode layer 530 has a multilayer structure in which a plurality of metal layers is laminated, but is not limited thereto and may be a single metal layer. The metal layer contains one or more metals. Based on the metal electrode layer 530 having a multilayer structure in which a plurality of metal layers is laminated, the metal electrode layer 530 includes, for example, a first stainless steel layer on the first resin layer 520, a Cu layer on the first stainless steel layer, and a second stainless steel layer on the Cu layer. The material of each of the first stainless steel layer and the second stainless steel layer is an alloy containing Fe, Ni, and Cr. Further, the metal electrode layer 530 is, for example, a Cu layer in the case of one metal layer. The metal electrode layer 530 covers a main surface 521 of the first resin layer 520 on a side opposite to the mounting substrate 501 side, an outer circumferential surface 523 of the first resin layer 520, an outer circumferential surface 513 of the mounting substrate 501, and an outer circumferential surface 543 of the second resin layer 540. A main surface 541 of the second resin layer 540 on a side opposite to the mounting substrate 501 side is not covered with the metal electrode layer 530 and is exposed. The metal electrode layer 530 is electrically connected to the ground layer of the mounting substrate 501. Thus, the radio-frequency module 500 can set the potential of the metal electrode layer 530 to substantially the same potential as the potential of the ground layer of the mounting substrate 501.

(2.2) Layout in Radio-Frequency Module

In plan view from the thickness direction D1 of the mounting substrate 501, at least a part of the first balun 7 overlaps the first switch 5 and the second switch 6, and at least a part of the second balun 8 overlaps the first switch 5 and the second switch 6. In the first balun 7, the first coil 71 and the second coil 72 face each other in the thickness direction D1 of the mounting substrate 501. In the second balun 8, the third coil 81 and the fourth coil 82 face each other in the thickness direction D1 of the mounting substrate 501.

(2.3) Summary

The radio-frequency module 500 according to Embodiment 1 includes the radio-frequency circuit 100 and the mounting substrate 501. The amplifier 3, the first switch 5, the second switch 6, the first balun 7, and the second balun 8 of the radio-frequency circuit 100 are arranged in the mounting substrate 501. The radio-frequency module 500 according to Embodiment 1 can suppress deterioration of the characteristics of the radio-frequency circuit 100.

In addition, in the radio-frequency module 500 according to Embodiment 1, the mounting substrate 501 has the first main surface 511 and the second main surface 512 facing each other. The amplifier 3 is arranged on the first main surface 511 of the mounting substrate 501. The first switch 5 and the second switch 6 are arranged on the second main surface 512 of the mounting substrate 501. The first balun 7 and the second balun 8 are arranged in the mounting substrate 501. In plan view from the thickness direction D1 of the mounting substrate 501, at least a part of the first balun 7 overlaps the first switch 5 and the second switch 6, and at least a part of the second balun 8 overlaps the first switch 5 and the second switch 6. In the radio-frequency module 500 according to Embodiment 1, it is possible to further suppress the deterioration of the characteristics of the radio-frequency circuit 100.

(3) Communication Device

As illustrated in FIG. 1, the communication device 600 according to Embodiment 1 includes the signal processing circuit 601 and the radio-frequency circuit 100. The signal processing circuit 601 is connected to the radio-frequency circuit 100.

The communication device 600 further includes the first antenna A1 and the second antenna A2. The communication device 600 further includes a circuit board on which the radio-frequency module 500 including the radio-frequency circuit 100 is mounted. The circuit board is, for example, a printed wiring board. The circuit board includes a ground electrode to which a ground potential is applied.

The signal processing circuit 601 includes, for example, the RF signal processing circuit 602 and the baseband signal processing circuit 603. The RF signal processing circuit 602 is, for example, a radio frequency integrated circuit (RFIC) and performs signal processing on a radio-frequency signal. For example, the RF signal processing circuit 602 performs signal processing such as up-conversion on the radio-frequency signal (transmission signal) output from the baseband signal processing circuit 603, and outputs the signal-processed radio-frequency signal. In addition, for example, the RF signal processing circuit 602 performs signal processing such as down-conversion on the radio-frequency signal (reception signal) output from the radio-frequency circuit 100 and outputs the signal-processed radio-frequency signal to the baseband signal processing circuit 603. The baseband signal processing circuit 603 is, for example, a baseband integrated circuit (BBIC). The baseband signal processing circuit 603 generates an I-phase signal and a Q-phase signal from the baseband signal. The baseband signal is, for example, an audio signal, an image signal, or the like input from the outside. The baseband signal processing circuit 603 performs IQ modulation processing by combining the I-phase signal and the Q-phase signal, and outputs a transmission signal. At this time, the transmission signal is generated as a modulated signal (IQ signal) obtained by amplitude-modulating a carrier signal having a predetermined frequency with a period longer than the period of the carrier signal. The reception signal processed by the baseband signal processing circuit 603 is used, for example, as an image signal for image display or as an audio signal for a call of the user of the communication device 600. The radio-frequency circuit 100 transmits radio-frequency signals (reception signals, transmission signals) between the first and second antennas A1 and A2 and the RF signal processing circuit 602 of the signal processing circuit 601.

Since the communication device 600 according to Embodiment 1 includes the radio-frequency circuit 100 and the signal processing circuit 601, it is possible to suppress deterioration of the characteristics of the radio-frequency circuit 100.

Embodiment 2

Figure 5:
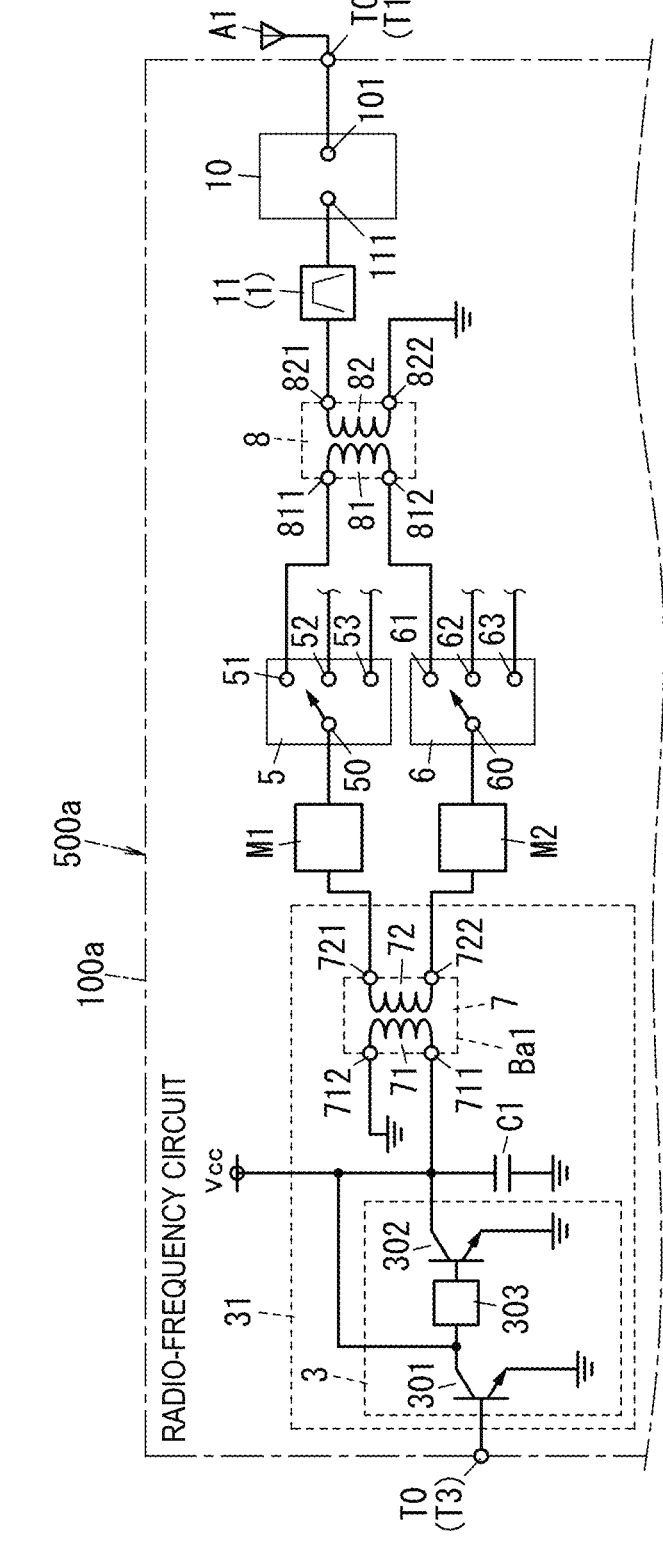
FIG. 5 is a circuit diagram of a radio-frequency circuit according to Embodiment 2.
Figure 6:
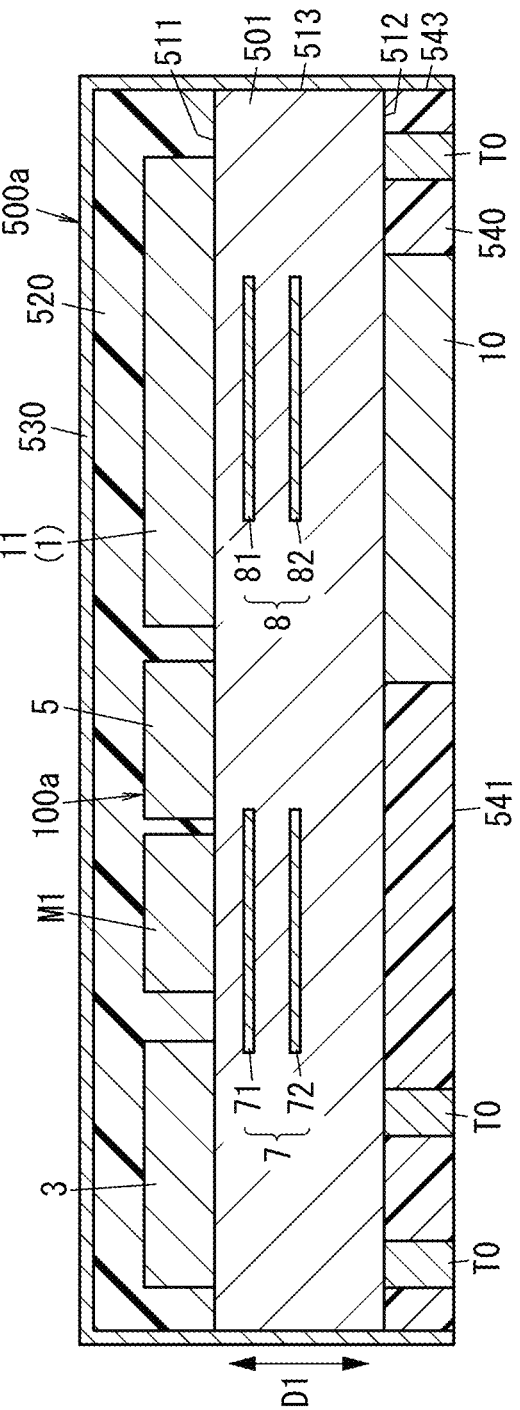
FIG. 6 is a cross-sectional view of a radio-frequency module including the above radio-frequency circuit.

A radio-frequency circuit 100a and a radio-frequency module 500a according to Embodiment 2 will be described with reference to FIG. 5 and FIG. 6. Regarding the radio-frequency circuit 100a and the radio-frequency module 500a according to Embodiment 2, the same components as those of the radio-frequency circuit 100 and the radio-frequency module 500 according to Embodiment 1 are denoted by the same reference signs, and description thereof will be omitted.

The radio-frequency circuit 100a according to Embodiment 2 is different from the radio-frequency circuit 100 according to Embodiment 1 in that the first power amplifier 31 includes the amplifier 3, a balun Ba1 for impedance matching, and a capacitor C1, and the balun Ba1 of the first power amplifier 31 and the first balun 7 are common. In the radio-frequency circuit 100a according to Embodiment 2, the amplifier 3 includes, for example, a transistor 301 in the drive stage, a transistor 302 in the final stage (output stage), and an interstage matching circuit 303 for matching the impedances of the transistor 301 in the drive stage and the transistor 302 in the final stage. In the amplifier 3, each of the transistor 301 in the drive stage and the transistor 302 in the final stage is, for example, a heterojunction bipolar transistor (HBT). The interstage matching circuit 303 is, for example, an inductor provided between the transistor 301 in the drive stage and the transistor 302 in the final stage, but may further include a capacitor in addition to the inductor. The number of stages of transistors in the amplifier 3 is not limited to two and may be one or three or more. The amplifier 3 is, for example, a GaAs-based chip.

In the first power amplifier 31, the first end 711 of the first balun 7 is connected to the output terminal of the amplifier 3 (the collector terminal of the transistor 302 in the final stage). The power supply voltage Vcc is applied to the collector terminal of the transistor 301 in the drive stage and the collector terminal of the transistor 302 in the final stage. The capacitor C1 is connected between the collector terminal of the transistor 302 in the final stage and the ground.

In the radio-frequency circuit 100a, since the switches (the first switch 5 and the second switch 6), which are nonlinear devices, are connected between the first balun 7 and the second balun 8 in the same manner as in the radio-frequency circuit 100 according to Embodiment 1, it possible to suppress deterioration of the characteristics of the radio-frequency circuit 100a.

In addition, the radio-frequency module 500a according to Embodiment 2 can suppress the deterioration of the characteristics of the radio-frequency circuit 100a. Further, the radio-frequency module 500a according to Embodiment 2 can achieve reduction in size as compared with the case where the balun of the first power amplifier 31 and the first balun 7 are separately provided.

Embodiment 3

Figure 7:
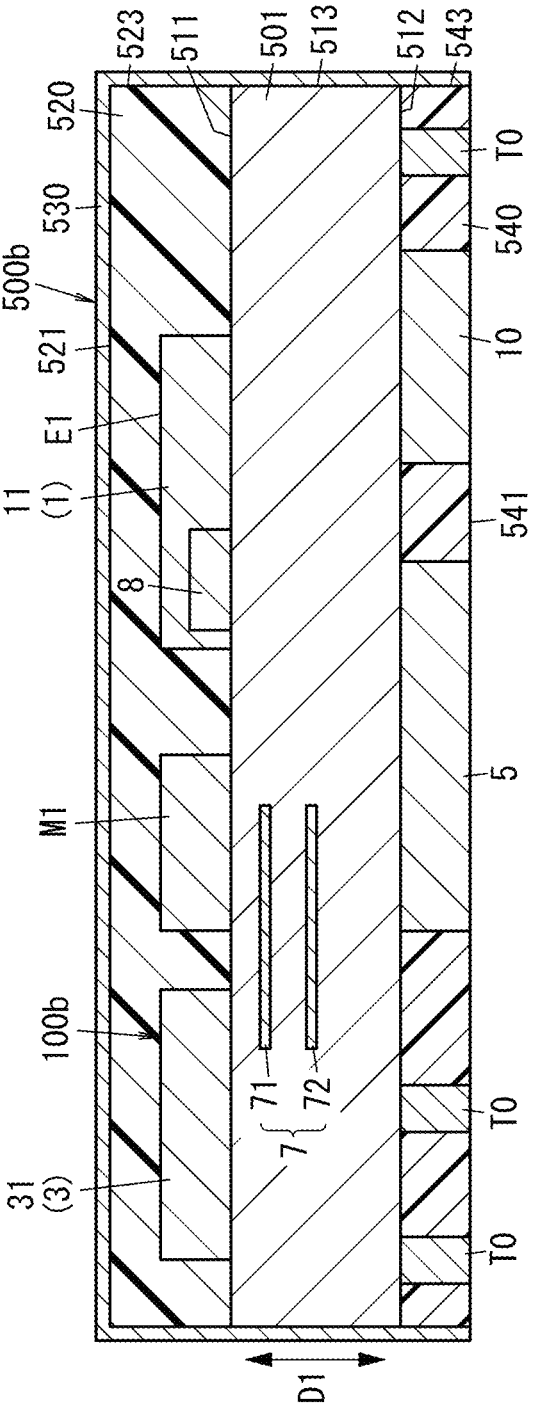
FIG. 7 is a cross-sectional view of a radio-frequency circuit according to Embodiment 3.

A radio-frequency circuit 100b and a radio-frequency module 500b according to Embodiment 3 will be described with reference to FIG. 7. Regarding the radio-frequency circuit 100b and the radio-frequency module 500b according to Embodiment 3, the same components as those of the radio-frequency circuit 100 and the radio-frequency module 500 according to Embodiment 1 are denoted by the same reference signs, and description thereof will be omitted.

The circuit configuration of the radio-frequency circuit 100b according to Embodiment 3 is the same as the circuit configuration of the radio-frequency circuit 100 according to Embodiment 1.

The radio-frequency module 500b according to Embodiment 3 is different from the radio-frequency module 500 according to Embodiment 1 in that the second balun 8 is not incorporated in the mounting substrate 501. In the radio-frequency module 500b, one of the plurality of electronic components mounted on the first main surface 511 of the mounting substrate 501 (hereinafter also referred to as an electronic component E1) includes the first transmission filter 11 (first filter 1) and the second balun 8. The electronic component E1 is a longitudinally coupled SAW filter including the first transmission filter 11 and the second balun 8.

In the radio-frequency circuit 100b, since the switches (the first switch 5 and the second switch 6), which are nonlinear devices, are connected between the first balun 7 and the second balun 8 in the same manner as in the radio-frequency circuit 100 according to Embodiment 1, it is possible to suppress deterioration of the characteristics of the radio-frequency circuit 100b.

In addition, since the radio-frequency module 500b includes the radio-frequency circuit 100b and the mounting substrate 501, it is possible to suppress deterioration of the characteristics of the radio-frequency circuit 100b.

Embodiment 4

A radio-frequency circuit 100c and a radio-frequency module 500c according to Embodiment 4 will be described with reference to FIG. 8 to FIG. 10. Regarding the radio-frequency circuit 100c and the radio-frequency module 500c according to Embodiment 4, the same components as those of the radio-frequency circuit 100 and the radio-frequency module 500 according to Embodiment 1 are denoted by the same reference signs, and description thereof will be omitted as appropriate.

Figure 8:
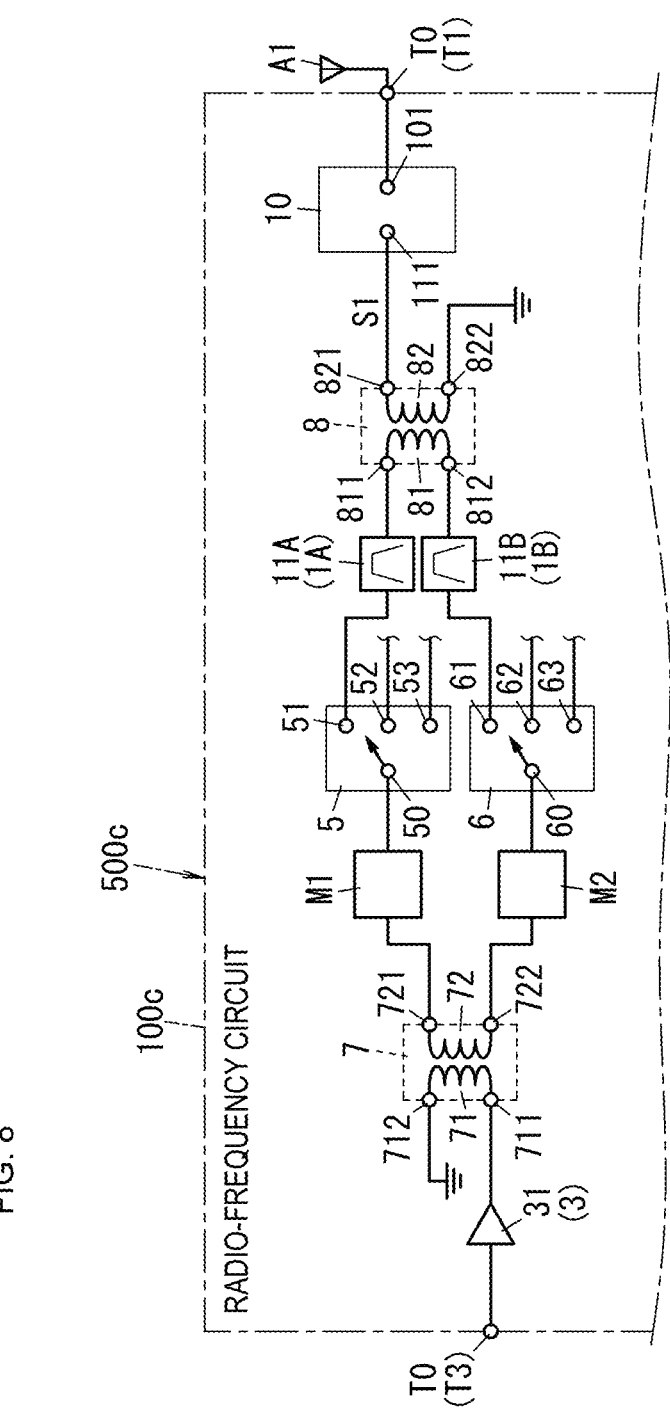
FIG. 8 is a circuit diagram of a radio-frequency circuit according to Embodiment 4.

As illustrated in FIG. 8, the radio-frequency circuit 100c according to Embodiment 4 is different from the radio-frequency circuit 100 according to Embodiment 1 in that the radio-frequency circuit 100c includes a first filter 1A (first transmission filter 11A) having a first pass band and a second filter 1B (second transmission filter 11B) having a second pass band that is the same as the first pass band are provided instead of the one filter 1. The first pass band of the first filter 1A and the second pass band of the second filter 1B include the uplink frequency band of the first communication band. In the second balun 8 in the radio-frequency circuit 100c, the first end 811 of the third coil 81 is connected to the first end 721 of the second coil 72 via the first filter 1A and the first switch 5, and the second end 822 of the third coil 81 is connected to the second end 722 of the second coil 72 via the second filter 1B and the second switch 6. In the second balun 8, the first end 821 of the fourth coil 82 is connected to a signal path S1, and the second end 822 of the fourth coil 82 is connected to the ground. The first end 821 of the fourth coil 82 of the second balun 8 is connected to the second terminal 111 of the third switch 10.

In the radio-frequency circuit 100c, the first filter 1A (first transmission filter 11A) is connected between (the selection terminal 51 of) the first switch 5 and (the first end 811 of) the third coil 81 of) the second balun 8, and the second filter 1B (second transmission filter 11B) is connected between (the selection terminal 61 of) the second switch 6 and (the second end 812 of the third coil 81 of) the second balun 8.

The radio-frequency circuit 100c according to Embodiment 4 includes the first filter 1A, the second filter 1B, the amplifier 3, the first switch 5, the second switch 6, the first balun 7, and the second balun 8. The first filter 1A has a first pass band. The second filter 1B has a second pass band that is the same as the first pass band. The amplifier 3 has the input terminal and the output terminal. The amplifier 3 is connected to the filter 1. The first balun 7 includes the first coil 71 and the second coil 72. The second balun 8 includes the third coil 81 and the fourth coil 82. In the first balun 7, the first end 711 of the first coil 71 is connected to the output terminal of the amplifier 3, and the second end 712 of the first coil 71 is connected to the ground. In the first balun 7, the first end 721 of the second coil 72 is connected to the first switch 5, and the second end 722 of the second coil 72 is connected to the second switch 6. In the second balun 8, the first end 811 of the third coil 81 is connected to the first end 721 of the second coil 72 via the first filter 1A and the first switch 5, and the second end 822 of the third coil 81 is connected to the second end 722 of the second coil 72 via the second filter 1B and the second switch 6. In the second balun 8, the first end 821 of the fourth coil 82 is connected to the signal path S1, and the second end 822 of the fourth coil 82 is connected to the ground.

The radio-frequency circuit 100c according to Embodiment 4 can suppress deterioration of the characteristics of the radio-frequency circuit 100c. More specifically, in the radio-frequency circuit 100c, since the switches (the first switch 5 and the second switch 6) which are nonlinear devices are connected between the first balun 7 and the second balun 8, it is possible to reduce power applied to the switches (the first switch 5 and the second switch 6). Accordingly, the radio-frequency circuit 100c can reduce the signal distortion of the radio-frequency signal in the switches (the first switch 5 and the second switch 6), and can suppress the deterioration of the characteristics of the radio-frequency circuit 100c. In addition, in the radio-frequency circuit 100c according to Embodiment 4, since the filters (the first filter 1A and the second filter 1B) which are nonlinear devices are connected between the first balun 7 and the second balun 8, it is possible to reduce power applied to the filters (the first filter 1A and the second filter 1B). Accordingly, the radio-frequency circuit 100c can reduce the signal distortion of the radio-frequency signal in the filter (each of the first filter 1A and the second filter 1B), and can suppress the deterioration of the characteristics of the radio-frequency circuit 100c. In addition, since the radio-frequency circuit 100c according to Embodiment 4 includes the first balun 7 and the second balun 8, it is possible to suppress a temperature rise of each of the switches (the first switch 5 and the second switch 6) and the filters (the first filter 1A and the second filter 1B).

Further, in the radio-frequency circuit 100c, the amplifier 3 is the power amplifier 31 that amplifies a transmission signal. The first balun 7 is connected to the output terminal of the amplifier 3. Therefore, the radio-frequency circuit 100c can suppress the signal distortion of the transmission signal.

In addition, the radio-frequency circuit 100c further includes the transmission filter 12 (see FIG. 1) and the second amplifier 4 (see FIG. 1) that is different from the first amplifier 3 serving as the amplifier 3, has the input terminal and the output terminal, and is connected to the transmission filter 12 (see FIG. 1). In the radio-frequency circuit 100c, the transmission filter 12 constitutes a third filter having a third pass band different from the first pass band of the first filter 1. The first pass band includes an uplink frequency band of the first communication band. The third pass band includes an uplink frequency band of the third communication band. The first communication band is, for example, Band 25 of the 3GPP LTE standard. The third communication band is, for example, Band 66 of the 3GPP LTE standard.

Therefore, for example, the radio-frequency circuit 100c can reduce the magnitude of IMD that occurs based on two uplink carrier aggregation being performed using the first amplifier 3 (first power amplifier 31) and the second amplifier 4 (second power amplifier 32).

Figure 9:
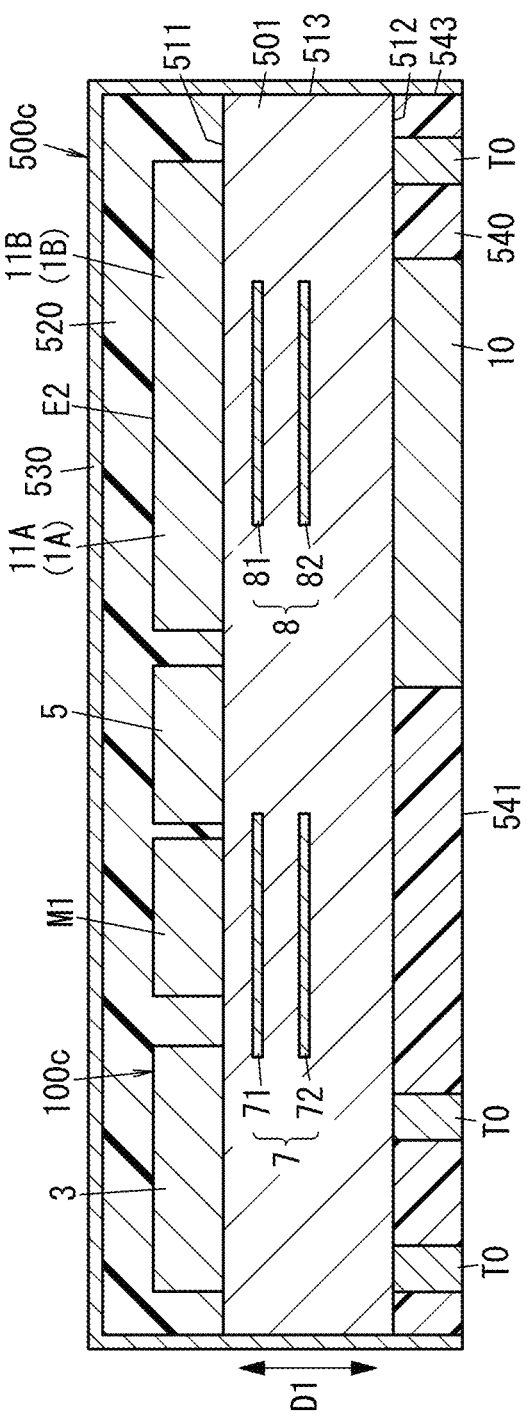
FIG. 9 is a cross-sectional view of a radio-frequency module including the above radio-frequency circuit.
Figure 10:
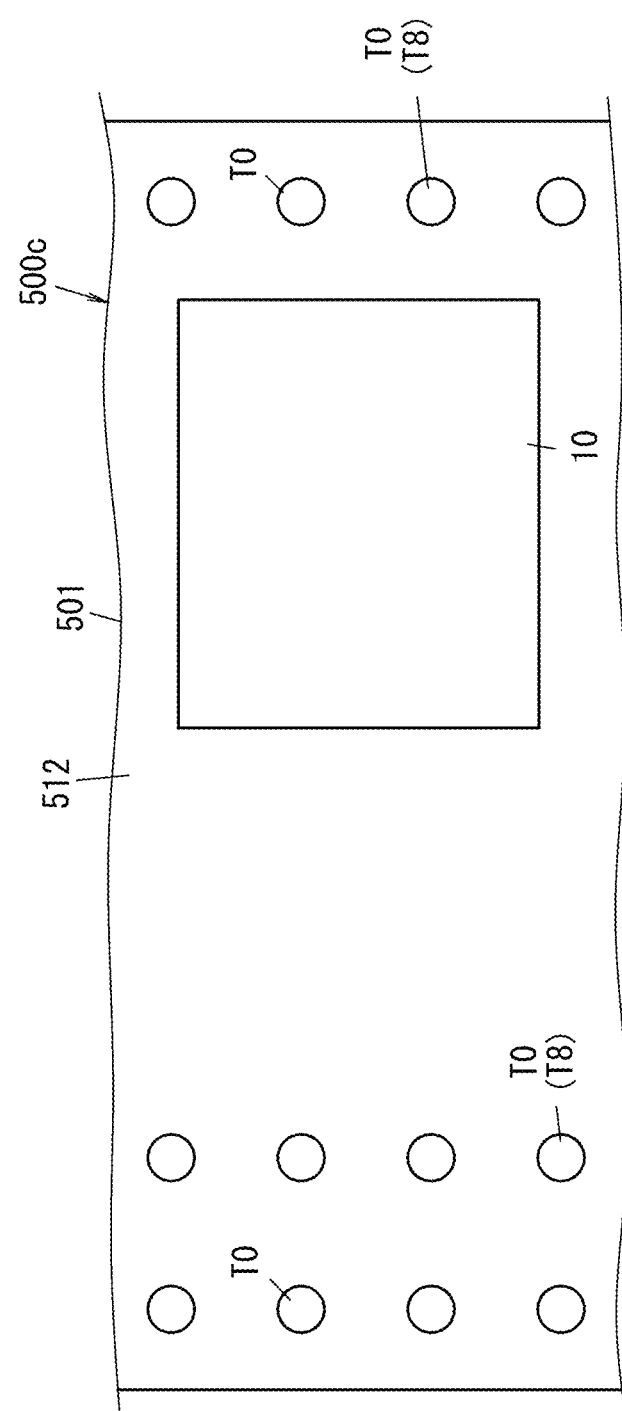
FIG. 10 is a bottom view of a radio-frequency module including the above radio-frequency circuit.

As illustrated in FIG. 9 and FIG. 10, the radio-frequency module 500c according to Embodiment 4 includes the radio-frequency circuit 100c and the mounting substrate 501.

In the radio-frequency module 500c, the first switch 5 and the second switch 6 are mounted on the first main surface 511 of the mounting substrate 501. Further, in the radio-frequency module 500c, one of the plurality of electronic components mounted on the first main surface 511 of the mounting substrate 501 (hereinafter also referred to as an electronic component E2) includes the first filter 1A and the second filter 1B. In the electronic component E2, the first filter 1A and the second filter 1B have a common piezoelectric substrate. The piezoelectric substrate is, for example, a piezoelectric substrate, but is not limited thereto.

Since the radio-frequency module 500c includes the radio-frequency circuit 100c and the mounting substrate 501, it is possible to suppress deterioration of characteristics of the radio-frequency circuit 100c.

Embodiment 5

Figure 11:
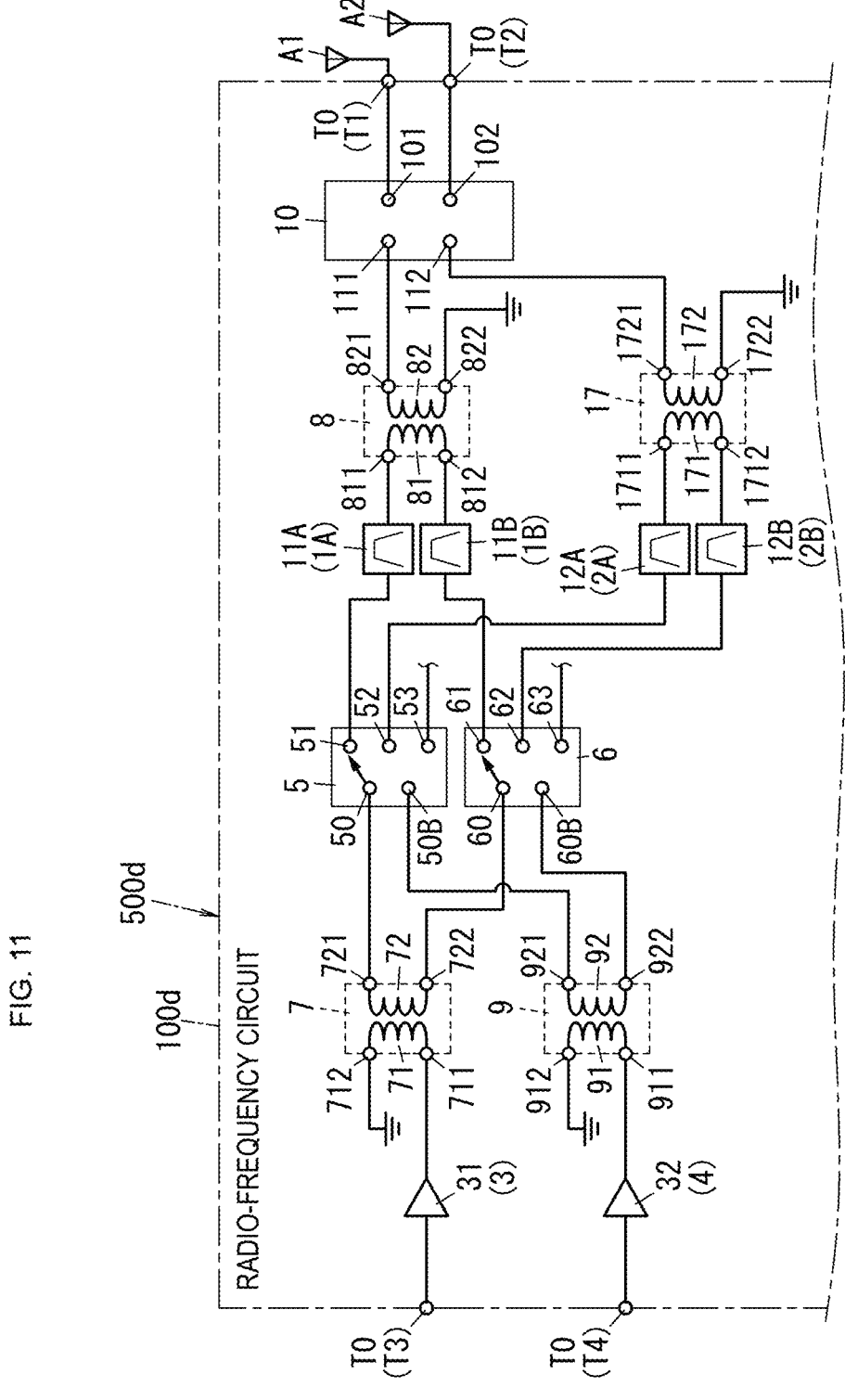
FIG. 11 is a circuit diagram of a radio-frequency circuit according to Embodiment 5.

A radio-frequency circuit 100d and a radio-frequency module 500d according to Embodiment 5 will be described with reference to FIG. 11. Regarding the radio-frequency circuit 100d and the radio-frequency module 500d according to Embodiment 5, the same components as those of the radio-frequency circuit 100c and the radio-frequency module 500c according to Embodiment 4 are denoted by the same reference signs, and description thereof will be omitted as appropriate.

The radio-frequency circuit 100d according to Embodiment 5 is different from the radio-frequency circuit 100c according to Embodiment 4 in that a third balun 9 and a fourth balun 17 are further provided. Further, the radio-frequency circuit 100d is different from the radio-frequency circuit 100c according to Embodiment 4 in that the radio-frequency circuit 100d includes a third filter 2A (third transmission filter 12A) and a fourth filter 2B (fourth transmission filter 12B) instead of the transmission filter 12. The third pass band of the third filter 2A and the fourth pass band of the fourth filter 2B include the uplink frequency band of the second communication band. The third balun 9 includes a fifth coil 91 and a sixth coil 92. In the third balun 9, a first end 911 of the fifth coil 91 is connected to the output terminal of the second amplifier 4 (second power amplifier 32), and a second end 912 of the fifth coil 91 is connected to the ground. In the third balun 9, a first end 921 of the sixth coil 92 is connected to the third filter 2A via the first switch 5, and a second end 922 of the sixth coil 92 is connected to the fourth filter 2B via the second switch 6. The fourth balun 17 includes a seventh coil 171 and an eighth coil 172.

In the radio-frequency circuit 100d, the first switch 5 further includes a common terminal 50B. In addition, in the radio-frequency circuit 100d, the second switch 6 further includes a common terminal 60B. In the radio-frequency circuit 100d, the common terminal 50 of the first switch 5 is connected to the first end 721 of the second coil 72 of the first balun 7, and the common terminal 50B of the first switch 5 is connected to the first end 921 of the sixth coil 92 of the third balun 9. In addition, in the radio-frequency circuit 100d, the common terminal 60 of the second switch 6 is connected to the second end 722 of the second coil 72 of the first balun 7, and the common terminal 60B of the second switch 6 is connected to the second end 922 of the sixth coil 92 of the third balun 9.

In the radio-frequency circuit 100d, the first end 811 of the third coil 81 of the second balun 8 is connected to the selection terminal 51 of the first switch 5 via the first filter 1A, and the second end 812 of the third coil 81 of the second balun 8 is connected to the selection terminal 61 of the second switch 6 via the second filter 1B. In addition, in the radio-frequency circuit 100d, the first end 821 of the fourth coil 82 of the second balun 8 is connected to the second terminal 111 of the third switch 10, and the second end 822 of the fourth coil 82 of the second balun 8 is connected to the ground. In addition, in the radio-frequency circuit 100d, a first end 1711 of the seventh coil 171 of the fourth balun 17 is connected to the selection terminal 52 of the first switch 5 via the third filter 2A, and a second end 1712 of the seventh coil 171 of the fourth balun 17 is connected to the selection terminal 62 of the second switch 6 via the fourth filter 2B. In addition, in the radio-frequency circuit 100d, a first end 1721 of the eighth coil 172 of the fourth balun 17 is connected to the second terminal 112 of the third switch 10, and a second end 1722 of the eighth coil 172 of the fourth balun 17 is connected to the ground.

Like the radio-frequency circuit 100c according to Embodiment 4, the radio-frequency circuit 100d according to Embodiment 5 can suppress deterioration of the characteristics of the radio-frequency circuit 100d. In addition, in the radio-frequency circuit 100d, since the filters (the third filter 2A and the fourth filter 2B) which are nonlinear devices are connected between the third balun 9 and the fourth balun 17, it is possible to reduce power applied to the filters (the third filter 2A and the fourth filter 2B). Accordingly, the radio-frequency circuit 100d can reduce the signal distortion of the radio-frequency signal in the filters (the third filter 2A and the fourth filter 2B), and can suppress the deterioration of the characteristics of the radio-frequency circuit 100d.

In addition, the radio-frequency circuit 100d can reduce the magnitude of IMD that occurs based on two uplink carrier aggregation being performed using the first amplifier

3 (first power amplifier 31) and the second amplifier 4 (second power amplifier 32), for example.

Since the radio-frequency module 500*d* includes the radio-frequency circuit 100*d* and the mounting substrate 501 (see FIG. 9), it is possible to suppress deterioration of characteristics of the radio-frequency circuit 100*d*.

Embodiment 6

Figure 12:
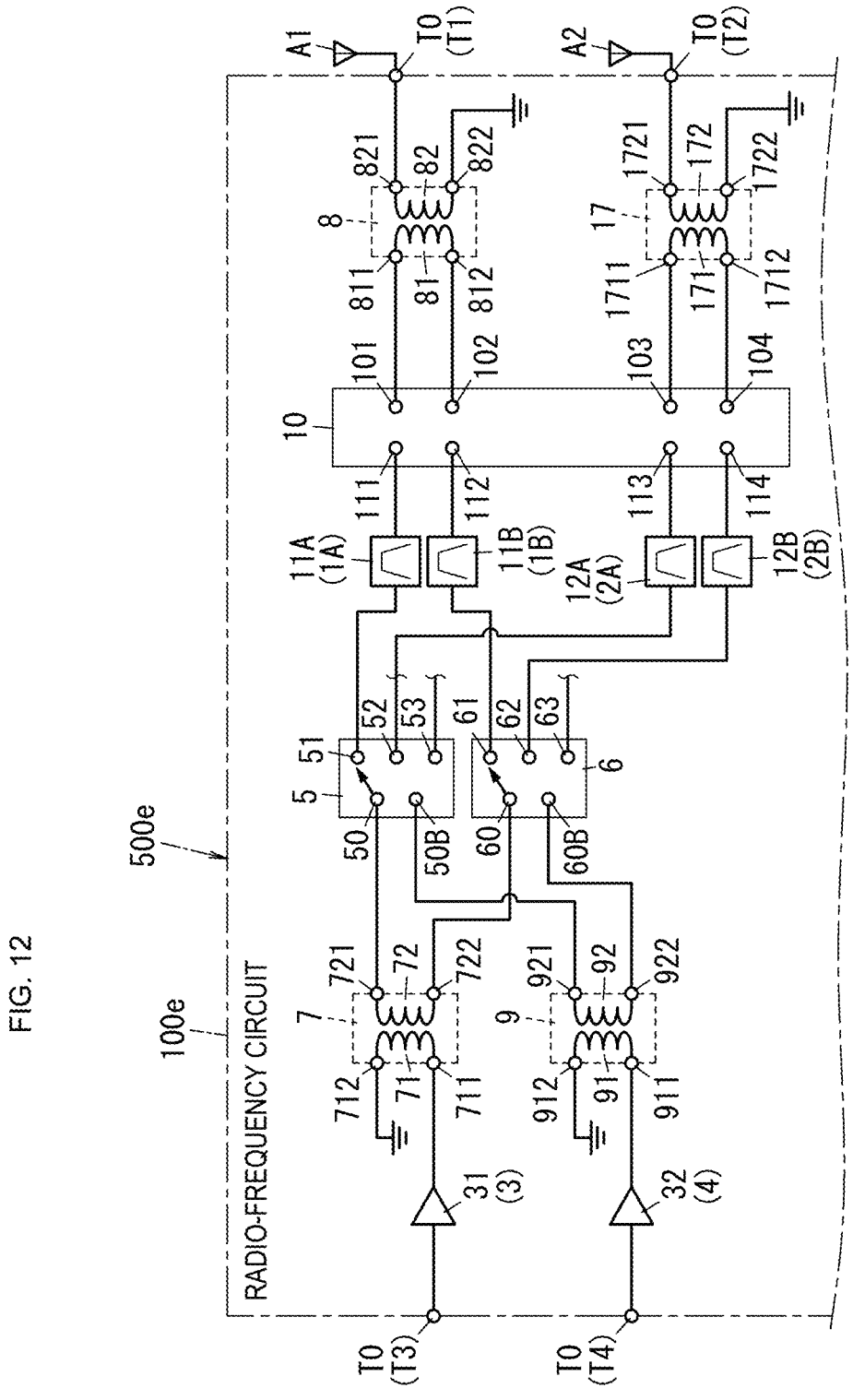
FIG. 12 is a circuit diagram of a radio-frequency circuit according to Embodiment 6.

A radio-frequency circuit 100*e* and a radio-frequency module 500*e* according to Embodiment 6 will be described with reference to FIG. 12. Regarding the radio-frequency circuit 100*e* and the radio-frequency module 500*e* according to Embodiment 6, the same components as those of the radio-frequency circuit 100*d* and the radio-frequency module 500*d* according to Embodiment 5 are denoted by the same reference signs, and description thereof will be omitted as appropriate.

The radio-frequency circuit 100*e* is different from the radio-frequency circuit 100*d* according to Embodiment 5 in that the first filter 1A and the second filter 1B are connected to the second balun 8 via the third switch 10. In addition, the radio-frequency circuit 100*e* is different from the radio-frequency circuit 100*d* according to Embodiment 5 in that the third switch 10 further has first terminals 103 and 104 and the third switch 10 further has second terminals 113 and 114. In the third switch 10, the first terminals 101, 102, 103, and 104 are connectable to the second terminals 111, 112, 113, and 114, respectively. In addition, the radio-frequency circuit 100*e* is different from the radio-frequency circuit 100*d* according to Embodiment 5 in that the third filter 2A and the fourth filter 2B are connected to the fourth balun 17 via the third switch 10.

In the third switch 10, the second terminal 111 is connected to the selection terminal 51 of the first switch 5 via the first filter 1A, and the first terminal 101 is connected to the first end 811 of the third coil 81 of the second balun 8. In addition, in the third switch 10, the second terminal 112 is connected to the selection terminal 61 of the second switch 6 via the second filter 1B. In addition, in the third switch 10, the second terminal 113 is connected to the selection terminal 52 of the first switch 5 via the third filter 2A, and the first terminal 103 is connected to the first end 1711 of the seventh coil 171 of the fourth balun 17. In addition, in the third switch 10, the second terminal 114 is connected to the selection terminal 62 of the second switch 6 via the fourth filter 2B, and the first terminal 104 is connected to the second end 1712 of the seventh coil 171 of the fourth balun 17.

In the radio-frequency circuit 100*e*, the first end 821 of the fourth coil 82 of the second balun 8 is connected to the antenna terminal T1, and the second end 822 of the fourth coil 82 of the second balun 8 is connected to the ground. In addition, in the radio-frequency circuit 100*e*, the first end 1721 of the eighth coil 172 of the fourth balun 17 is connected to the antenna terminal T2, and the second end 1722 of the eighth coil 172 of the fourth balun 17 is connected to the ground.

Like the radio-frequency circuit 100*d* according to Embodiment 5, the radio-frequency circuit 100*e* according to Embodiment 6 can suppress deterioration of the characteristics of the radio-frequency circuit 100*e*. In addition, in the radio-frequency circuit 100*e* according to Embodiment 6, since the third switch 10, which is a nonlinear device, is connected between the first balun 7 and the second balun 8, it is possible to reduce power applied to the third switch 10. Accordingly, the radio-frequency circuit 100*d* can reduce the signal distortion of the radio-frequency signal in the third switch 10, and can suppress the deterioration of the characteristics of the radio-frequency circuit 100*e*.

For example, the radio-frequency circuit 100*e* can reduce the magnitude of IMD that occurs based on two uplink carrier aggregation using the first amplifier 3 (first power amplifier 31) and the second amplifier 4 (second power amplifier 32) being performed.

In addition, since the radio-frequency module 500*e* includes the radio-frequency circuit 100*e* and the mounting substrate 501 (see FIG. 9), it is possible to suppress the deterioration of the characteristics of the radio-frequency circuit 100*e*.

Embodiment 7

Figure 13:
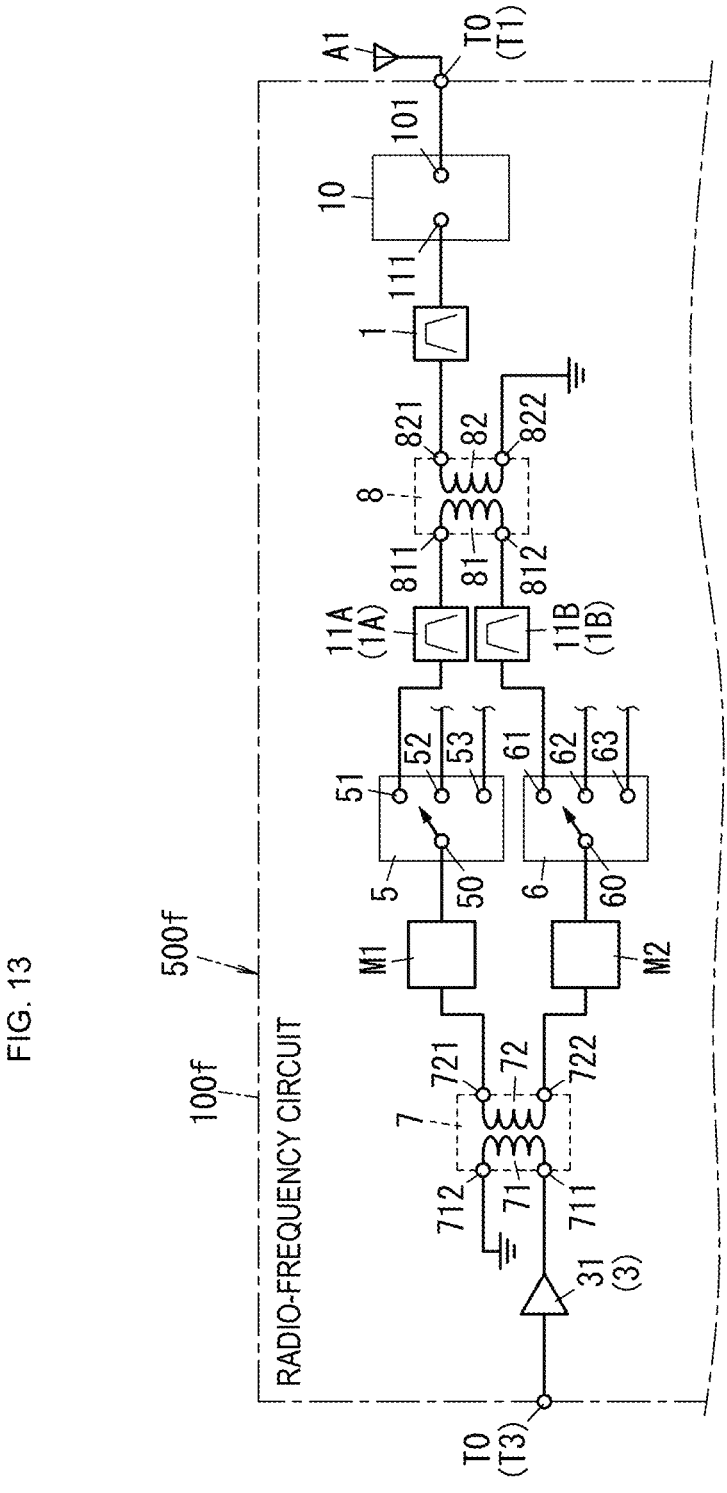
FIG. 13 is a circuit diagram of a radio-frequency circuit according to Embodiment 7.

A radio-frequency circuit 100*f* and a radio-frequency module 500*f* according to Embodiment 7 will be described with reference to FIG. 13. Regarding the radio-frequency circuit 100*f* and the radio-frequency module 500*f* according to Embodiment 7, the same components as those of the radio-frequency circuit 100*c* (see FIG. 8) and the radio-frequency module 500*c* according to Embodiment 4 are denoted by the same reference signs, and description thereof will be omitted as appropriate.

The radio-frequency circuit 100*f* according to Embodiment 7 is different from the radio-frequency circuit 100*c* according to Embodiment 4 in that the radio-frequency circuit 100*f* further includes the filter 1 connected between the first end 821 of the fourth coil 82 of the second balun 8 and the third switch 10.

The pass band of the filter 1 is the same as the first pass band of the first filter 1A.

In the radio-frequency circuit 100*f* according to Embodiment 7, since the switches (the first switch 5 and the second switch 6) are connected between the first balun 7 and the second balun 8 similarly to the radio-frequency circuit 100*c* according to Embodiment 4, it is possible to suppress deterioration of the characteristics of the radio-frequency circuit 100*f*. In addition, in the radio-frequency circuit 100*f* according to Embodiment 7, since the filters (the first filter 1A and the second filter 1B) are connected between the first balun 7 and the second balun 8 similarly to the radio-frequency circuit 100*c* according to Embodiment 4, it is possible to suppress the deterioration of the characteristics of the radio-frequency circuit 100*f*.

In addition, since the radio-frequency circuit 100*f* according to Embodiment 7 further includes the filter 1, it is possible to improve the attenuation characteristics.

In addition, since the radio-frequency module 500*f* includes the radio-frequency circuit 100*f* and the mounting substrate 501 (see FIG. 9), it is possible to suppress the deterioration of the characteristics of the radio-frequency circuit 100*f*.

Embodiment 8

Figure 14:
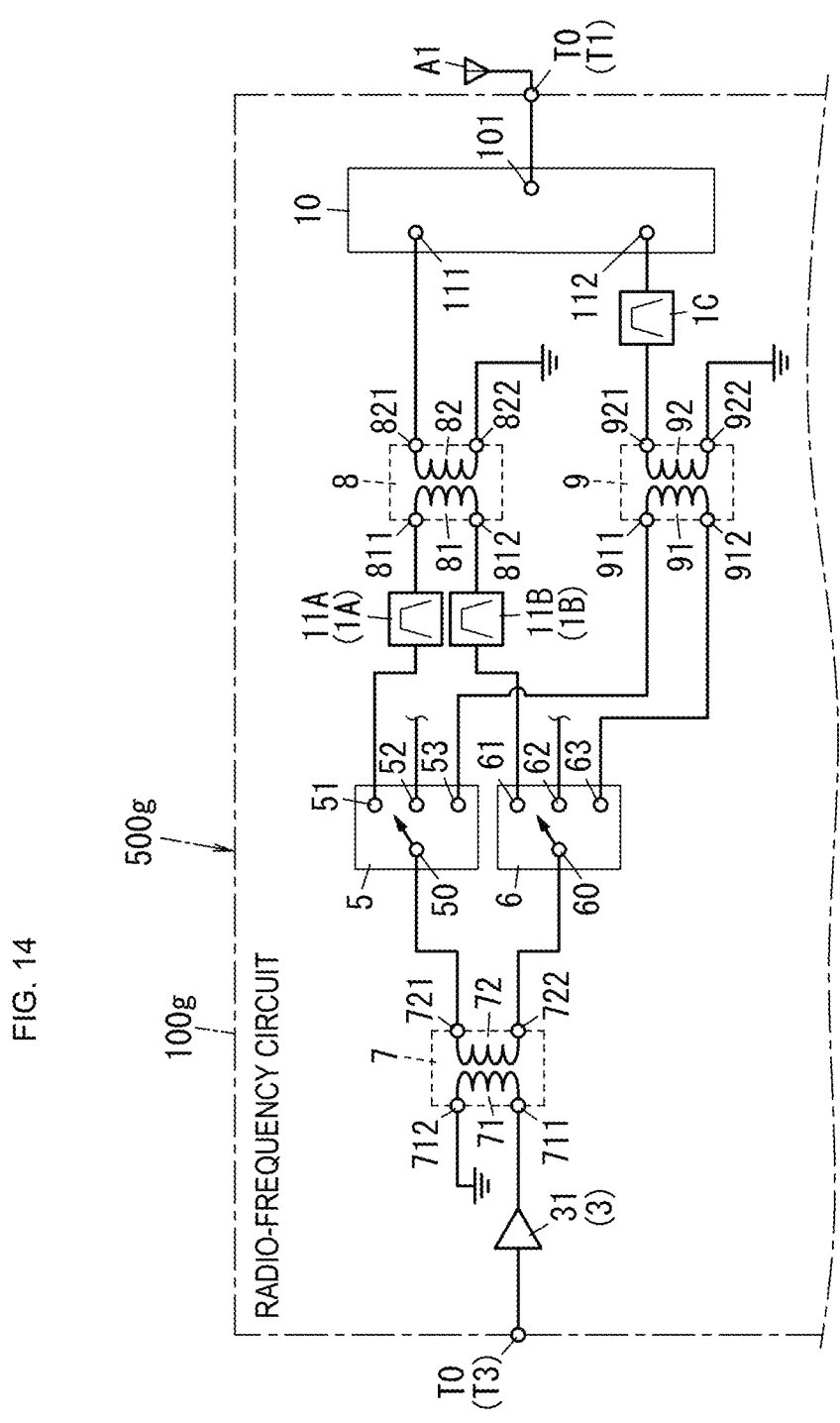
FIG. 14 is a circuit diagram of a radio-frequency circuit according to Embodiment 8.

A radio-frequency circuit 100*g* and a radio-frequency module 500*g* according to Embodiment 8 will be described with reference to FIG. 14. Regarding the radio-frequency circuit 100*g* and the radio-frequency module 500*g* according to Embodiment 8, the same components as those of the radio-frequency circuit 100*c* (see FIG. 8) and the radio-frequency module 500*c* according to Embodiment 4 are denoted by the same reference signs, and description thereof will be omitted as appropriate.

The radio-frequency circuit 100g is different from the radio-frequency circuit 100c according to Embodiment 4 in that the radio-frequency circuit 100g further includes the third balun 9 and a third filter 1C. The third balun 9 includes the fifth coil 91 and the sixth coil 92. In the third balun 9, the first end 911 of the fifth coil 91 is connected to the selection terminal 53 of the first switch 5, and the second end 912 of the fifth coil 91 is connected to the selection terminal 63 of the second switch 6. In the third balun 9, the first end 921 of the sixth coil 92 is connected to the second terminal 112 of the third switch 10 via the third filter 1C, and the second end 922 of the sixth coil 92 is connected to the ground. In the third switch 10, the first terminal 101 is connected to at least one of the two second terminals 111 or 112.

In the radio-frequency circuit 100g according to Embodiment 8, since the switches (the first switch 5 and the second switch 6) are connected between the first balun 7 and the second balun 8 similarly to the radio-frequency circuit 100c according to Embodiment 4, it is possible to suppress deterioration of the characteristics of the radio-frequency circuit 100g. In addition, in the radio-frequency circuit 100g according to Embodiment 8, since the filters (the first filter 1A and the second filter 1B) are connected between the first balun 7 and the second balun 8 similarly to the radio-frequency circuit 100c according to Embodiment 4, it is possible to suppress the deterioration of the characteristics of the radio-frequency circuit 100g.

In addition, since the radio-frequency module 500g includes the radio-frequency circuit 100g and the mounting substrate 501 (see FIG. 9), it is possible to suppress the deterioration of the characteristics of the radio-frequency circuit 100g.

Embodiment 9

Figure 15:
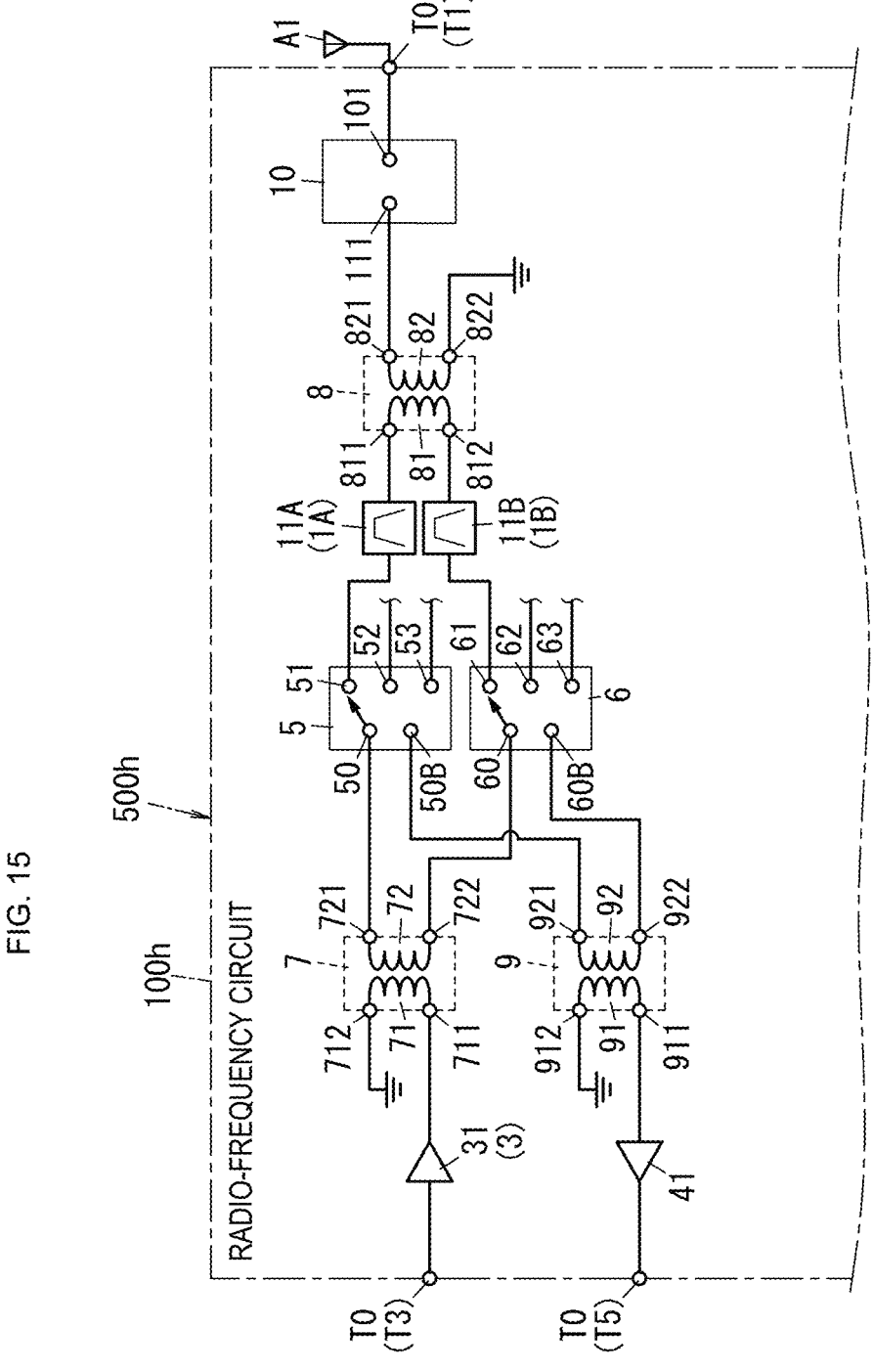
FIG. 15 is a circuit diagram of a radio-frequency circuit according to Embodiment 9.

A radio-frequency circuit 100h and a radio-frequency module 500h according to Embodiment 9 will be described with reference to FIG. 15. Regarding the radio-frequency circuit 100h and the radio-frequency module 500h according to Embodiment 9, the same components as those of the radio-frequency circuit 100c (see FIG. 8) and the radio-frequency module 500c according to Embodiment 4 are denoted by the same reference signs, and description thereof will be omitted as appropriate.

The radio-frequency circuit 100h is different from the radio-frequency circuit 100c according to Embodiment 4 in that the radio-frequency circuit 100h further includes the third balun 9. In addition, the radio-frequency circuit 100h is different from the radio-frequency circuit 100c according to Embodiment 4 in that the first switch 5 further includes the common terminal 50B different from the common terminal 50, and the second switch 6 further includes the common terminal 60B different from the common terminal 60.

The third balun 9 includes the fifth coil 91 and the sixth coil 92. In the third balun 9, the first end 911 of the fifth coil 91 is connected to the input terminal of the low noise amplifier 41, and the second end 912 of the fifth coil 91 is connected to the ground. In the third balun 9, the first end 921 of the sixth coil 92 is connected to the common terminal 50B of the first switch 5, and the second end 922 of the sixth coil 92 is connected to the common terminal 60B of the second switch 6.

In the first switch 5, the common terminals 50 and 50B each can be connected to the selection terminal 51. The first switch 5 is a switch capable of connecting at least one of the three selection terminals 51 to 53 to each of the common terminals 50 and 50B.

In the radio-frequency circuit 100h, the pass band of the filter 1 includes a frequency band of the first communication band used for communication corresponding to time division duplex (TDD) as a communication system. The radio-frequency circuit 100h can realize, in a simulated manner, simultaneous transmission and reception of a transmission signal of the frequency band of the first communication band and a reception signal of the frequency band of the first communication band by, for example, TDD. "Realized in a simulated manner" means that the transmission of the transmission signal and the reception of the reception signal are not performed at the same time but are performed in a short period of time that can be regarded as the same time. The first communication band is, for example, Band 34 of the 3GPP LTE standard, but is not limited thereto, and may be, for example, Band 39 of the 3GPP LTE standard.

Based on the radio-frequency circuit 100h transmitting a transmission signal of the frequency band of the first communication band in the TDD communication system, the common terminal 50 of the first switch 5 is connected to the selection terminal 51, and the common terminal 60 of the second switch 6 is connected to the selection terminal 61. In addition, based on the radio-frequency circuit 100h receiving a reception signal of the frequency band of the first communication band in the TDD communication system, the common terminal 50B of the first switch 5 is connected to the selection terminal 51, and the common terminal 60B of the second switch 6 is connected to the selection terminal 61.

In the radio-frequency circuit 100h according to Embodiment 9, since the switches (the first switch 5 and the second switch 6) and the filters (the first filter 1A and the second filter 1B) are connected between the first balun 7 and the second balun 8, it is possible to suppress deterioration of the characteristics of the radio-frequency circuit 100h. In addition, in the radio-frequency circuit 100h according to Embodiment 9, since the switches (the first switch 5 and the second switch 6) and the filters (the first filter 1A and the second filter 1B) are connected between the third balun 9 and the second balun 8, it is possible to suppress the deterioration of the characteristics of the radio-frequency circuit 100h. More specifically, the radio-frequency circuit 100h can suppress the signal distortion of each of the transmission signal and the reception signal based on performing communication by TDD, and can suppress the deterioration of the characteristics of the radio-frequency circuit 100h.

In addition, since the radio-frequency module 500h includes the radio-frequency circuit 100h and the mounting substrate 501 (see FIG. 9), it is possible to suppress the deterioration of the characteristics of the radio-frequency circuit 100h.

Embodiment 10

Figure 16:
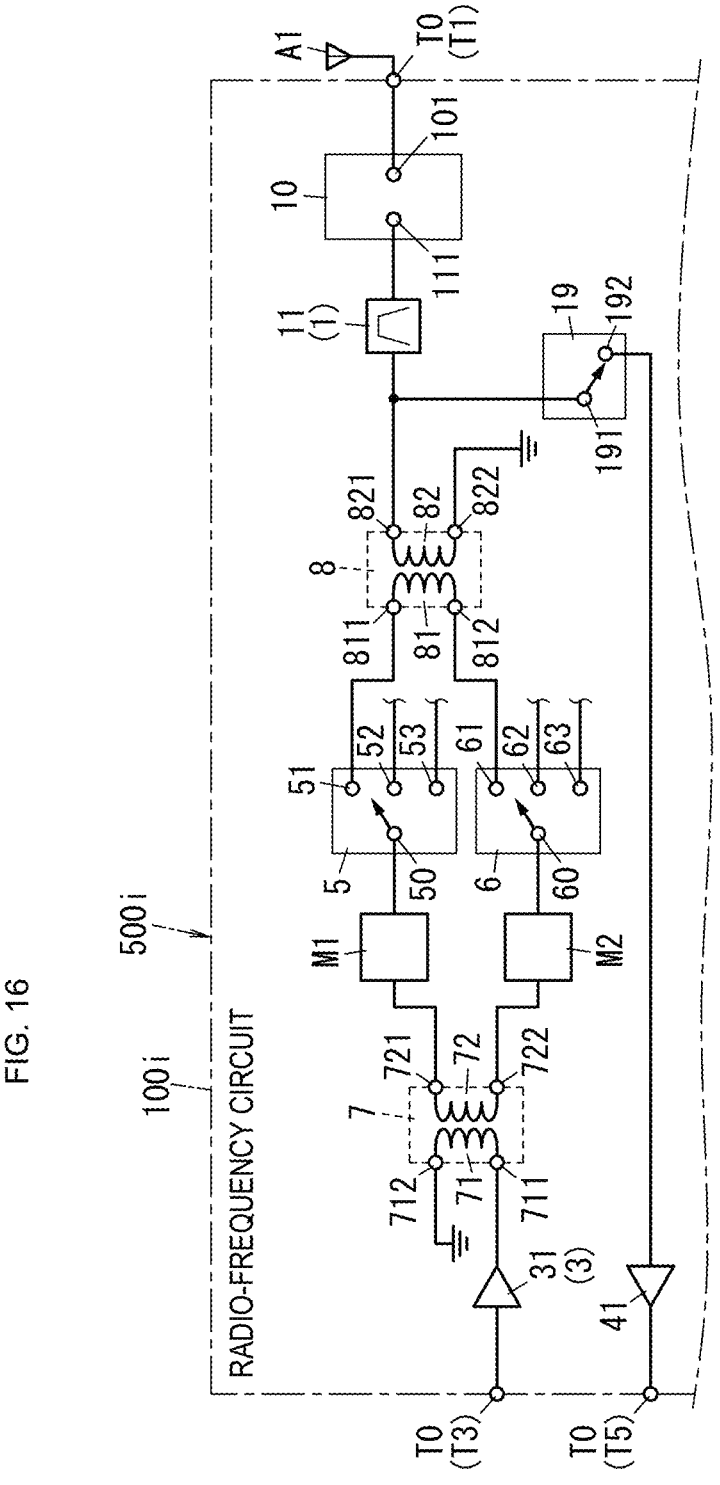
FIG. 16 is a circuit diagram of a radio-frequency circuit according to Embodiment 10.

A radio-frequency circuit 100i and a radio-frequency module 500i according to Embodiment 10 will be described with reference to FIG. 16. Regarding the radio-frequency circuit 100i and the radio-frequency module 500i according to Embodiment 10, the same components as those of the radio-frequency circuit 100 (see FIG. 1 and FIG. 2) and the radio-frequency module 500 according to Embodiment 1 are denoted by the same reference signs, and description thereof will be omitted as appropriate.

The radio-frequency circuit 100*i* is different from the radio-frequency circuit 100 according to Embodiment 1 in that the radio-frequency circuit 100*i* further includes a switch 19. The switch 19 includes a first terminal 191 and a second terminal 192 that is connectable to the first terminal 191. In the switch 19, the first terminal 191 is connected to a node between the first end 821 of the fourth coil 82 of the second balun 8 and the filter 1. In addition, in the switch 19, the second terminal 192 is connected to the input terminal of the low noise amplifier 41.

In the radio-frequency circuit 100*i*, the pass band of the filter 1 includes the frequency band of the first communication band used for communication corresponding to TDD as the communication system. The radio-frequency circuit 100*i* can realize, in a simulated manner, simultaneous transmission and reception of a transmission signal of the frequency band of the first communication band and a reception signal of the frequency band of the first communication band by, for example, TDD. The first communication band is, for example, Band 34 of the 3GPP LTE standard, but is not limited thereto, and may be, for example, Band 39 of the 3GPP LTE standard.

Based on the radio-frequency circuit 100*i* transmitting a transmission signal of the frequency band of the first communication band in the TDD communication system, the common terminal 50 of the first switch 5 is connected to only the selection terminal 51 of the plurality of selection terminals 51 to 53, the common terminal 60 of the second switch 6 is connected to only the selection terminal 61 of the plurality of selection terminals 61 to 63, and the first terminal 191 of the switch 19 is not connected to the second terminal 192. In addition, based on the radio-frequency circuit 100*i* receiving a reception signal of the frequency band of the first communication band in the TDD communication system, the first terminal 191 of the switch 19 is connected to the second terminal 192, the common terminal 50 of the first switch 5 is not connected to any of the plurality of selection terminals 51 to 53, and the common terminal 60 of the second switch 6 is not connected to any of the plurality of selection terminals 61 to 63.

In the radio-frequency circuit 100*i* according to Embodiment 10, since the switches (the first switch 5 and the second switch 6) are connected between the first balun 7 and the second balun 8, it is possible to suppress deterioration of the characteristics of the radio-frequency circuit 100*i*. More specifically, the radio-frequency circuit 100*i* can suppress the signal distortion of a transmission signal based on performing communication by TDD, and can suppress the deterioration of the characteristics of the radio-frequency circuit 100*i*.

In addition, since the radio-frequency module 500*i* includes the radio-frequency circuit 100*i* and the mounting substrate 501 (see FIG. 3A and FIG. 3B), it is possible to suppress the deterioration of the characteristics of the radio-frequency circuit 100*i*.

Embodiment 11

Figure 17:
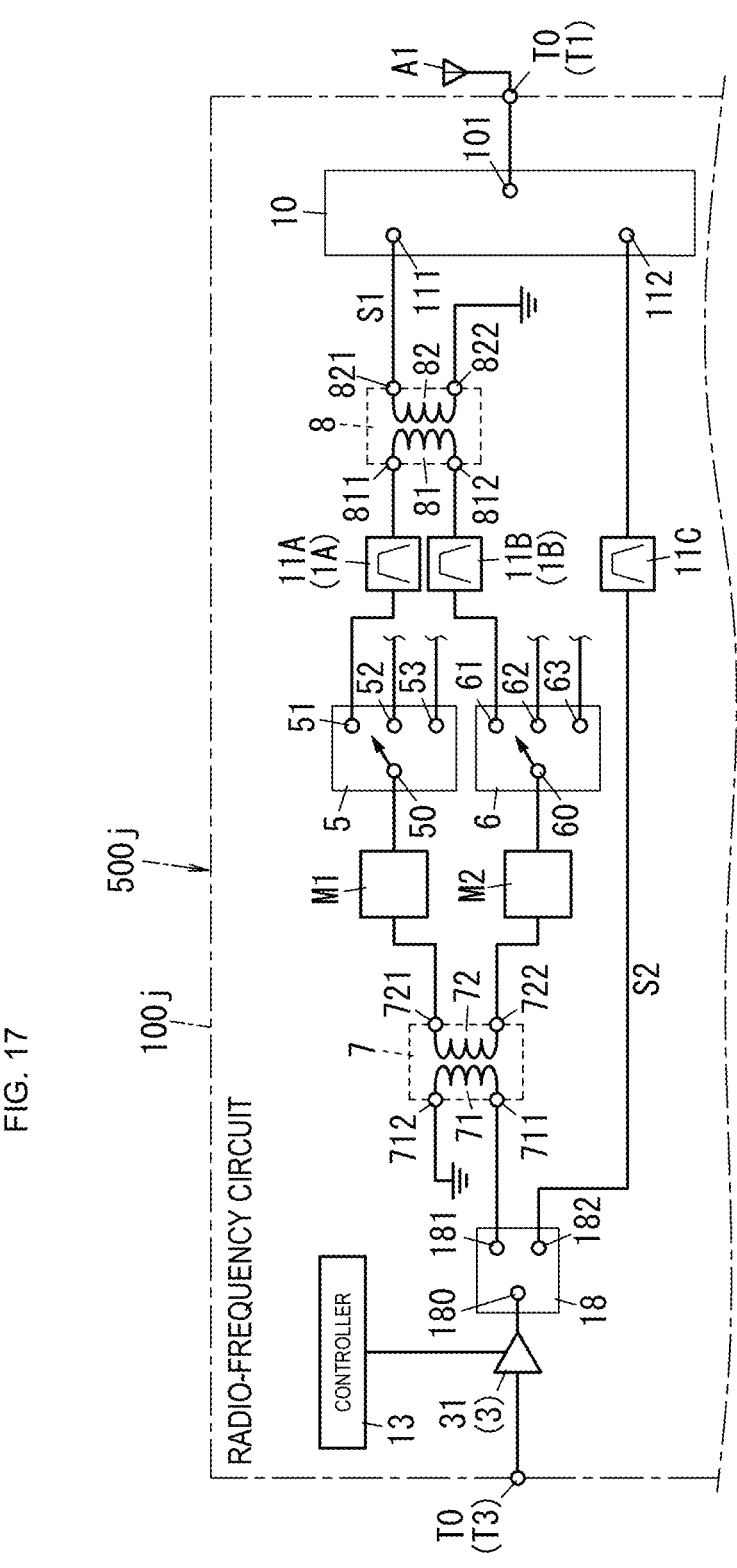
FIG. 17 is a circuit diagram of a radio-frequency circuit according to Embodiment 11.

A radio-frequency circuit 100*j* and a radio-frequency module 500*j* according to Embodiment 11 will be described with reference to FIG. 17. Regarding the radio-frequency circuit 100*j* and the radio-frequency module 500*j* according to Embodiment 11, the same components as those of the radio-frequency circuit 100*c* (see FIG. 8) and the radio-frequency module 500*c* according to Embodiment 4 are denoted by the same reference signs, and description thereof will be omitted as appropriate.

The radio-frequency circuit 100*j* is different from the radio-frequency circuit 100*c* according to Embodiment 4 in that the radio-frequency circuit 100*j* further includes a switch 18 and a transmission filter 11C.

The switch 18 is connected between the output terminal of the amplifier 3 (power amplifier 31) and the first balun 7. In the radio-frequency circuit 100*j* according to Embodiment 11, the switch 18 constitutes a fourth switch connected between the output terminal of the amplifier 3 and the first balun 7. The switch 18 includes a common terminal 180 and a plurality of (for example, two) selection terminals 181 and 182. The common terminal 180 is connected to the output terminal of the amplifier 3. The selection terminal 181 is connected to the first end 711 of the first coil 71 in the first balun 7. The selection terminal 182 is connected to the third switch 10, not via the first balun 7 and the second balun 8, but via the transmission filter 11C. The transmission filter 11C is provided in a signal path (bypass path) S2 between the selection terminal 182 of the switch 18 and the third switch 10. The switch 18 is a switch capable of selectively connecting the common terminal 180 to one of the plurality of selection terminals 181 or 182. The switch 18 is controlled by, for example, the signal processing circuit 601 (see FIG. 1). The switch 18 switches the connection state between the common terminal 180 and the two selection terminals 181 and 182 in accordance with a control signal from the RF signal processing circuit 602 of the signal processing circuit 601. The switch 18 is, for example, a switch IC.

The transmission filter 11C has the same pass band as the first pass band of the first filter 1.

In the radio-frequency circuit 100*j*, the amplifier 3 can operate in a first power mode (for example, a high-power mode) and a second power mode (for example, a low-power mode) with lower output power than that in the first power mode. In the high-power mode, the amplifier 3 sets the output power of the amplifier 3 to first predetermined power (e.g., 32 dBm). In addition, in the low-power mode, the amplifier 3 sets the output power of the amplifier 3 to second predetermined power (for example, 15 dBm) lower than the first predetermined power.

The controller 13 operates the amplifier 3 in the first power mode or the second power mode according to the control signal from the signal processing circuit 601.

In the radio-frequency circuit 100*j*, based on the controller 13 operating the amplifier 3 in the first power mode, the switch 18 electrically connects the output terminal of the amplifier 3 to the first balun 7 and electrically disconnects the output terminal of the amplifier 3 from the transmission filter 11C. More specifically, based on the controller 13 operating the amplifier 3 in the first power mode, the common terminal 180 and one selection terminal 181 of the two selection terminals 181 and 182 are connected to each other in the switch 18.

In the radio-frequency circuit 100*j*, based on the controller 13 operating the amplifier 3 in the second power mode, the switch 18 electrically disconnects the output terminal of the amplifier 3 from the first balun 7 and electrically connects the output terminal of the amplifier 3 to the transmission filter 11C. More specifically, based on the controller 13 operating the amplifier 3 in the second power mode, the common terminal 180 and one selection terminal 182 of the two selection terminals 181 and 182 are connected to each other in the switch 18. Thus, the amplifier 3 is connected to the third switch 10 via the transmission filter 11C, not via the first balun 7 and the second balun 8.

In the radio-frequency circuit 100j according to Embodiment 11, since the switches (the first switch 5 and the second switch 6) which are nonlinear devices are connected between the first balun 7 and the second balun 8, it is possible to reduce power applied to the switches (the first switch 5 and the second switch 6). As such, the radio-frequency circuit 100j can reduce the signal distortion of the radio-frequency signal in the switches (the first switch 5 and the second switch 6) based on the amplifier 3 operating in the first power mode, and can suppress deterioration of the characteristics of the radio-frequency circuit 100j. In addition, in the radio-frequency circuit 100j according to Embodiment 11, since the filters (the first filter 1A and the second filter 1B) which are nonlinear devices are connected between the first balun 7 and the second balun 8, it is possible to reduce power applied to the filters (the first filter 1A and the second filter 1B). Accordingly, the radio-frequency circuit 100j can reduce the signal distortion of the radio-frequency signal in the filter (each of the first filter 1A and the second filter 1B) based on the amplifier 3 operating in the first power mode, and can suppress the deterioration of the characteristics of the radio-frequency circuit 100j.

In addition, the radio-frequency circuit 100j can reduce the magnitude of IMD that occurs based on, for example, the first amplifier 3 operating in the first power mode and two uplink carrier aggregation is performed using the first amplifier 3 (first power amplifier 31) and the second amplifier 4 (second power amplifier 32).

In addition, since the radio-frequency module 500j includes the radio-frequency circuit 100j and the mounting substrate 501 (see FIG. 9), it is possible to suppress the deterioration of the characteristics of the radio-frequency circuit 100j.

Embodiment 12

Figure 18:
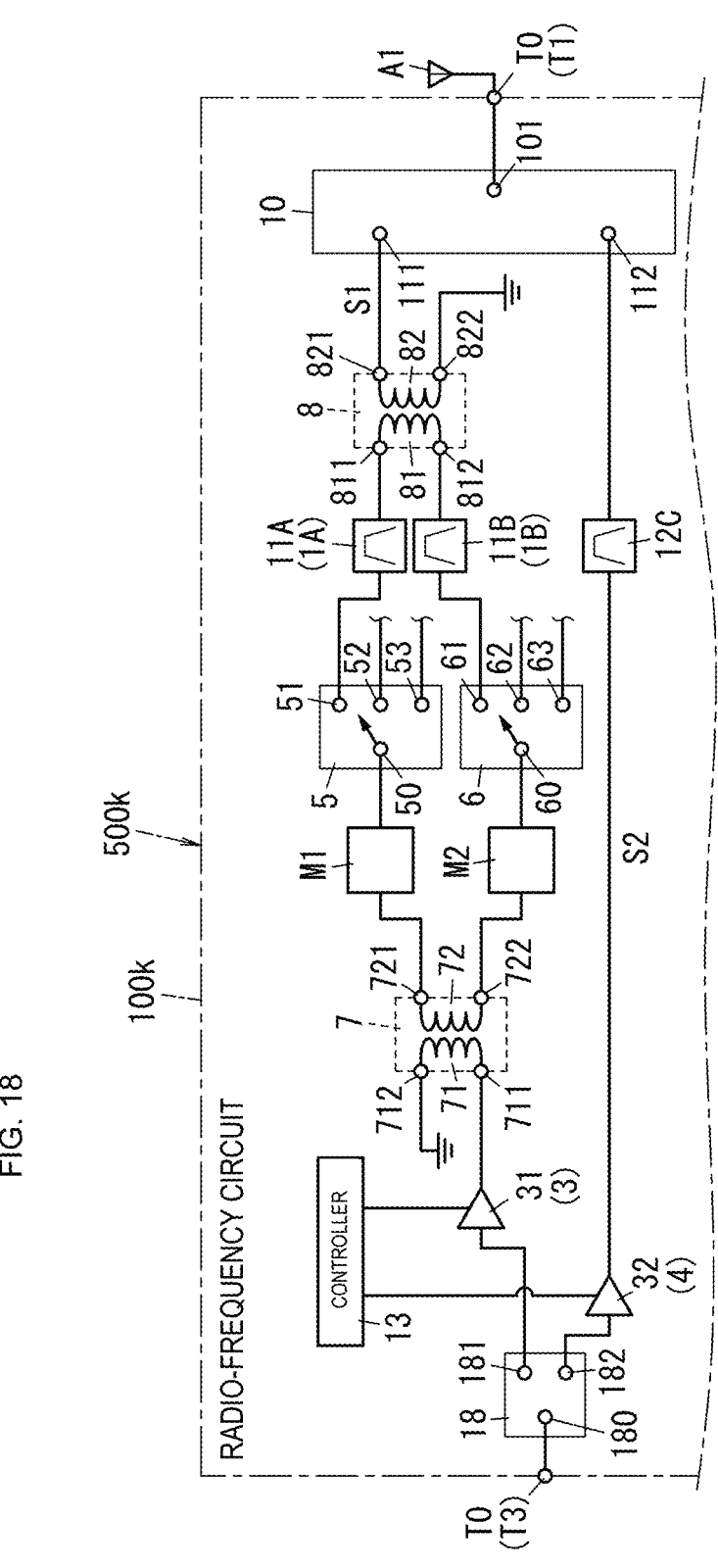
FIG. 18 is a circuit diagram of a radio-frequency circuit according to Embodiment 12.

A radio-frequency circuit 100k and a radio-frequency module 500k according to Embodiment 12 will be described with reference to FIG. 18. Regarding the radio-frequency circuit 100k and the radio-frequency module 500k according to Embodiment 12, the same components as those of the radio-frequency circuit 100c (see FIG. 8) and the radio-frequency module 500c according to Embodiment 4 are denoted by the same reference signs, and description thereof will be omitted as appropriate.

The radio-frequency circuit 100k is different from the radio-frequency circuit 100c according to Embodiment 4 in that the radio-frequency circuit 100k further includes the switch 18.

The switch 18 is connected between the input terminal of the first amplifier 3 (first power amplifier 31) and the signal input terminal T3. The switch 18 includes the common terminal 180 and the plurality of (for example, two) selection terminals 181 and 182. The common terminal 180 is connected to the signal input terminal T3. The selection terminal 181 is connected to the input terminal of the first amplifier 3 (first power amplifier 31). The selection terminal 182 is connected to the input terminal of the second amplifier 4 (second power amplifier 32). The output terminal of the second amplifier 4 is connected to the third switch 10, not via the first balun 7 and the second balun 8, but via a transmission filter 12C. The transmission filter 12C is provided in the signal path (bypass path) S2 between the output terminal of the second amplifier 4 and the second terminal 112 of the third switch 10. The switch 18 is a switch capable of selectively connecting the common terminal 180 to one of the plurality of selection terminals 181 or 182. The switch 18 is controlled by, for example, the signal processing circuit 601 included in the communication device 600 (see FIG. 1). The switch 18 switches the connection state between the common terminal 180 and the two selection terminals 181 and 182 in accordance with a control signal from the RF signal processing circuit 602 of the signal processing circuit 601. The switch 18 is, for example, a switch IC.

The first power amplifier 31 and the second power amplifier 32 correspond to power classes different from each other. The "power class" is a classification (User Equipment Power Class) of output power of a terminal (communication device 600) defined by maximum output power or the like, and indicates that a smaller number described next to the "power class" corresponds to higher output power. For example, the maximum output power (29 dBm) of a power class 1 is greater than the maximum output power (26 dBm) of a power class 2, and the maximum output power (26 dBm) of the power class 2 is greater than the maximum output power (23 dBm) of a power class 3. The measurement of the maximum output power is performed, for example, by a method defined by 3GPP or the like. The first power amplifier 31 corresponds to a first power class (for example, power class 2), and the second power amplifier 32 corresponds to a second power class (for example, power class 3) whose maximum output power is smaller than that of the first power class. In the radio-frequency circuit 100k, the controller 13 controls, for example, the first power amplifier 31 and the second power amplifier 32 in accordance with a control signal from the signal processing circuit 601.

In the radio-frequency circuit 100k, the first pass band and the second pass band of the first filter 1A and the second filter 1B, respectively, which pass the transmission signal from the first amplifier 3 corresponding to the first power class (for example, power class 2) include the frequency band of the first communication band used for communication corresponding to TDD as the communication system. The radio-frequency circuit 100k can realize, in a simulated manner, simultaneous transmission and reception of a transmission signal of the frequency band of the first communication band and a reception signal of the frequency band of the first communication band by, for example, TDD. The first communication band is, for example, Band 41 of the 3GPP LTE standard or n41 of the 5G NR, but is not limited thereto, and may be, for example, Band 40 of the 3GPP LTE standard or n40 of the 5G NR. In addition, in the radio-frequency circuit 100k, the pass band of the transmission filter 12C that passes transmission signals from the second amplifier 4 corresponding to the second power class (for example, power class 3) includes the uplink frequency band of the second communication band used for communication corresponding to frequency division duplex (FDD) as the communication system. The second communication band is, for example, Band 7 of the 3GPP LTE standard or n7 of the 5G NR, but is not limited thereto.

In the radio-frequency circuit 100k according to Embodiment 12, since the switches (the first switch 5 and the second switch 6) which are nonlinear devices are connected between the first balun 7 and the second balun 8, it is possible to reduce power applied to the switches (the first switch 5 and the second switch 6). As such, the radio-frequency circuit 100k can reduce the signal distortion of the radio-frequency signal in the switches (the first switch 5 and the second switch 6) based on the first amplifier 3 of the first power class operating, and can suppress deterioration of the characteristics of the radio-frequency circuit 100k. In addition, in the radio-frequency circuit 100k according to Embodiment 12, since the filters (the first filter 1A and the second filter 1B) which are nonlinear devices are connected between the first balun 7 and the second balun 8, it is possible to reduce power applied to the filters (the first filter 1A and the second filter 1B). As a result, the radio-frequency circuit 100k can reduce the signal distortion of the radio-frequency signal in the filter (each of the first filter 1A and the second filter 1B) based on the first amplifier 3 operating, and can suppress the deterioration of the characteristics of the radio-frequency circuit 100k.

In addition, since the radio-frequency module 500k includes the radio-frequency circuit 100k and the mounting substrate 501 (see FIG. 9), it is possible to suppress the deterioration of the characteristics of the radio-frequency circuit 100k.

Embodiment 13

Figure 19:
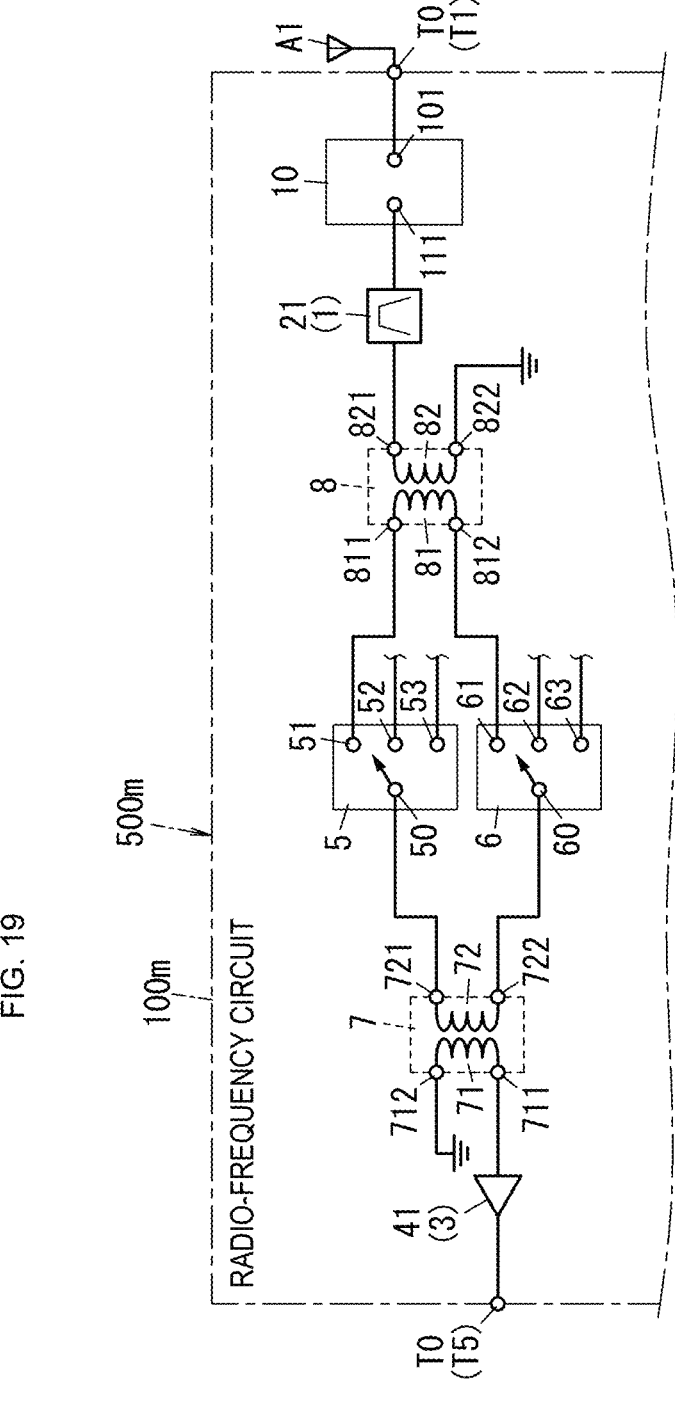
FIG. 19 is a circuit diagram of a radio-frequency circuit according to Embodiment 13.

A radio-frequency circuit 100m and a radio-frequency module 500m according to Embodiment 13 will be described with reference to FIG. 19. Regarding the radio-frequency circuit 100m and the radio-frequency module 500m according to Embodiment 13, the same components as those of the radio-frequency circuit 100 (see FIG. 1 and FIG. 2) and the radio-frequency module 500 according to Embodiment 1 are denoted by the same reference signs, and description thereof will be omitted as appropriate.

The radio-frequency circuit 100m according to Embodiment 13 includes the filter 1 (reception filter 21), the amplifier 3 (low noise amplifier 41), the first switch 5, the second switch 6, the first balun 7, and the second balun 8. The filter 1 has a pass band. The amplifier 3 has the input terminal and the output terminal. The amplifier 3 is connected to the filter 1. The first balun 7 includes the first coil 71 and the second coil 72. The second balun 8 includes the third coil 81 and the fourth coil 82. In the first balun 7, the first end 711 of the first coil 71 is connected to the input terminal of the amplifier 3, and the second end 712 of the first coil 71 is connected to the ground. In the first balun 7, the first end 721 of the second coil 72 is connected to the first switch 5, and the second end 722 of the second coil 72 is connected to the second switch 6. In the second balun 8, the first end 811 of the third coil 81 is connected to the first end 721 of the second coil 72 via the first switch 5, and the second end 812 of the third coil 81 is connected to the second end 722 of the second coil 72 via the second switch 6. In the second balun 8, the first end 821 of the fourth coil 82 is connected to the filter 1, and the second end 822 of the fourth coil 82 is connected to the ground.

In addition, the radio-frequency circuit 100m further includes the antenna terminal T1 and the third switch 10 connected between the antenna terminal T1 and the second balun 8. The third switch 10 is configured to be able to connect the first filter 1 and the first antenna terminal T1. The third switch 10 includes the first terminal 101 and the second terminal 111 that is connectable to the first terminal 101. In the third switch 10, the first terminal 101 is connected to the antenna terminal T1 and the second terminal 111 is connected to the input terminal of the filter 1. In addition, in the radio-frequency circuit 100m, the output terminal of the amplifier 3 (low noise amplifier 41) is connected to the first signal output terminal T5.

The radio-frequency circuit 100m according to Embodiment 13 can suppress deterioration of the characteristics of the radio-frequency circuit 100m. More specifically, in the radio-frequency circuit 100m, since the switches (the first switch 5 and the second switch 6) which are nonlinear devices are connected between the first balun 7 and the second balun 8, it is possible to reduce power applied to the switches (the first switch 5 and the second switch 6). Accordingly, the radio-frequency circuit 100m can reduce the signal distortion of the radio-frequency signal in the switches (the first switch 5 and the second switch 6), and can suppress the deterioration of the characteristics of the radio-frequency circuit 100m.

In addition, in the radio-frequency circuit 100m according to Embodiment 13, the amplifier 3 is a low noise amplifier 41 that amplifies a reception signal. The first balun 7 is connected to the input terminal of the amplifier 3. Therefore, the radio-frequency circuit 100m according to Embodiment 13 can suppress the signal distortion of a radio-frequency signal (reception signal) in the switches (the first switch 5 and the second switch 6).

The radio-frequency module 500m according to Embodiment 13 includes the radio-frequency circuit 100m and a mounting substrate. Since the configuration of the mounting substrate is the same as that of the mounting substrate 501 in the radio-frequency module 500 according to Embodiment 1, illustration and description thereof will be omitted. Since the radio-frequency module 500m according to Embodiment 13 includes the radio-frequency circuit 100m, it is possible to suppress the deterioration of the characteristics of the radio-frequency circuit 100m.

(Modification)

The above-described Embodiments 1 to 13 and the like are merely one of various embodiments of the present disclosure. The above-described Embodiments 1 to 13 and the like can be variously modified in accordance with the design and the like as long as the object of the present disclosure can be achieved.

For example, in the radio-frequency circuit 100, the first matching circuit M1 is connected between the first end 721 of the second coil 72 of the first balun 7 and the first switch 5, and the second matching circuit M2 is connected between the second end 722 of the second coil 72 of the first balun 7 and the second switch 6, however, the configuration is not limited thereto, and may be a configuration in which the first matching circuit M1 and the second matching circuit M2 are not provided. In addition, in the radio-frequency circuit 100, the first matching circuit M1 may be connected between the first end 711 of the first balun 7 and the amplifier 3, and the second matching circuit M2 may be connected between the second end 712 of the first balun 7 and the ground. In addition, in the radio-frequency circuit 100, the first matching circuit M1 may be connected between the first switch 5 and the first end 811 of the third coil 81 of the second balun 8, and the second matching circuit M2 may be connected between the second switch 6 and the second end 812 of the third coil 81 of the second balun 8. Further, in the radio-frequency circuit 100, the first matching circuit M1 may be connected between the first end 821 of the fourth coil 82 of the second balun 8 and the filter 1, and the second matching circuit M2 may be connected between the second end 822 of the fourth coil 82 of the second balun 8 and the ground.

In addition, the communication device 600 according to Embodiment 1 may include any of the radio-frequency circuits 100a, 100b, 100c, 100d, 100e, 100f, 100g, 100h, 100i, 100j, 100k, and 100m instead of the radio-frequency circuit 100.

In addition, the above-described acoustic wave filter is an acoustic wave filter using a surface acoustic wave or a bulk acoustic wave, but is not limited thereto and, for example, may be an acoustic wave filter using boundary acoustic waves, plate waves, or the like.

In addition, the radio-frequency module 500 may have a configuration in which the plurality of external connection terminals TO is a ball bump and the second resin layer 540 is not provided. The material of the ball bump constituting each of the plurality of external connection terminals TO is, for example, gold, cupper, solder, or the like. The plurality of external connection terminals TO may be a mixture of the external connection terminal TO formed by the ball bump and the external connection terminal TO formed by the columnar electrode.

In addition, a radio-frequency circuit of another example may include a 3 dB hybrid coupler instead of each of the first balun 7 and the second balun 8, in any one of the radio-frequency circuits 100, 100a, 100b, 100c, 100d, 100e, 100f, 100g, 100h, 100i, 100j, 100k, and 100m. As a result, the radio-frequency circuit of the other example can suppress the deterioration of the characteristics of the radio-frequency circuit, similarly to the radio-frequency circuit 100, 100a, 100b, 100c, 100d, 100e, 100f, 100g, 100h, 100i, 100j, 100k, and 100m. In the radio-frequency circuit of the other example, based on a 90 degree hybrid coupler being employed as the 3 dB hybrid coupler, an additional effect of improving the input/output return loss can be obtained.

(Aspect)

The following aspects are disclosed in the present specification.

A radio-frequency circuit (100; 100a; 100b; 100i; 100m) according to a first aspect includes a filter (1), an amplifier (3), a first switch (5), a second switch (6), a first balun (7), and a second balun (8). The amplifier (3) has an input terminal and an output terminal. The amplifier (3) is connected to the filter (1). The first balun (7) has a first coil (71) and a second coil (72). The second balun (8) has a third coil (81) and a fourth coil (82). In the first balun (7), a first end (711) of the first coil (71) is connected to a terminal of the input terminal and the output terminal of the amplifier (3) which is connected to the filter (1), and a second end (712) of the first coil (71) is connected to the ground. In the first balun (7), a first end (721) of the second coil (72) is connected to the first switch (5), and a second end (722) of the second coil (72) is connected to the second switch (6). In the second balun (8), a first end (811) of the third coil (81) is connected to a first end (721) of the second coil (72) via the first switch 5, and a second end (812) of the third coil (81) is connected to a second end (722) of the second coil (72) via the second switch (6). In the second balun (8), a first end (821) of the fourth coil (82) is connected to the filter (1), and a second end (822) of the fourth coil (82) is connected to the ground.

In the radio-frequency circuit (100; 100a; 100b; 100i; 100m) according to the first aspect, since the switches (the first switch 5 and the second switch 6) which are nonlinear devices are connected between the first balun (7) and the second balun (8), it is possible to reduce power applied to the switches (the first switch 5 and the second switch 6). As a result, the radio-frequency circuit (100; 100a; 100b; 100i; 100m) according to the first aspect can reduce signal distortion of a radio-frequency signal in the switches (the first switch 5 and the second switch 6), and can suppress deterioration of the characteristics of the radio-frequency circuit (100; 100a; 100b; 100i; 100m).

A radio-frequency circuit (100c; 100d; 100e; 100f; 100g; 100h; 100j; 100k) according to a second aspect includes a first filter (1A), a second filter (1B), the amplifier (3), the first switch (5), the second switch (6), the first balun (7), and the second balun (8). The first filter (1A) has a first pass band. The second filter (1B) has a second pass band that is the same as the first pass band. The amplifier (3) has the input terminal and the output terminal. The amplifier (3) is connected to the first filter (1A) and the second filter (1B). The first balun (7) has the first coil (71) and the second coil (72). The second balun (8) has the third coil (81) and the fourth coil (82). In the first balun (7), the first end (711) of the first coil 71 is connected to a terminal of the input terminal and the output terminal of the amplifier (3) which is connected to the first filter (1A) and the second filter (1B), and the second end (712) of the first coil (71) is connected to the ground. In the first balun (7), the first end (721) of the second coil (72) is connected to the first switch (5), and the second end (722) of the second coil (72) is connected to the second switch (6). In the second balun (8), the first end (811) of the third coil (81) is connected to the first end (721) of the second coil (72) via the first filter (1A) and the first switch (5), and the second end (822) of the third coil (81) is connected to the second end (722) of the second coil (72) via the second filter (1B) and the second switch (6). In the second balun (8), the first end (821) of the fourth coil (82) is connected to a signal path (S1), and the second end (822) of the fourth coil (82) is connected to the ground.

In the radio-frequency circuit (100c; 100d; 100e; 100f; 100g; 100h; 100j; 100k) according to the second aspect, since the switches (the first switch 5 and the second switch 6) which are nonlinear devices are connected between the first balun (7) and the second balun (8), it is possible to reduce power applied to the switches (the first switch 5 and the second switch 6). As such, the radio-frequency circuit (100c; 100d; 100e; 100f; 100g; 100h; 100j; 100k) according to the second aspect can reduce the signal distortion of the radio-frequency signal in the switches (the first switch 5 and the second switch 6), and can suppress the deterioration of the characteristics of the radio-frequency circuit (100c; 100d; 100e; 100f; 100g; 100h; 100j; 100k). In addition, in the radio-frequency circuit (100c; 100d; 100e; 100f; 100g; 100h; 100j; 100k) according to the second aspect, since the filters (the first filter 1A and the second filter 1B) which are nonlinear devices are connected between the first balun (7) and the second balun (8), it is possible to reduce power applied to the filters (each of the first filter 1A and the second filter 1B). Accordingly, the radio-frequency circuit (100c; 100d; 100e; 100f; 100g; 100h; 100j; 100k) according to the second aspect can reduce the signal distortion of the radio-frequency signal in the filter (each of the first filter 1A and the second filter 1B), and can suppress the deterioration of the characteristics of the radio-frequency circuit (100c; 100d; 100e; 100f; 100g; 100h; 100j; 100k).

The radio-frequency circuit (100; 100a; 100b; 100i; 100m) according to a third aspect further includes a second filter (2) and a second amplifier (4) in the first aspect. The second filter (2) is different from the first filter (1) serving as the filter (1). The second amplifier (4) is different from the first amplifier (3) serving as the amplifier (3) and has an input terminal and an output terminal. The second amplifier (4) is connected to the second filter (2). The first filter (1) has a first pass band. The second filter (2) has a second pass band different from the first pass band. The first amplifier (3) is a first power amplifier (31) that amplifies a first transmission signal. The second amplifier (4) is a second power amplifier (32) that amplifies a second transmission signal different from the first transmission signal.

The radio-frequency circuit (100; 100a; 100b; 100i; 100m) according to the third aspect can reduce the magnitude of IMD that occurs based on two uplink carrier aggregation being performed using the first amplifier (3) and the second amplifier (4), for example.

The radio-frequency circuit (100*c*; 100*d*; 100*e*; 100*f*; 100*g*; 100*h*; 100*j*) according to a fourth aspect further includes a third filter (transmission filter 12) and the second amplifier (4) in the second aspect. The third filter (transmission filter 12) has a third pass band different from the first pass band. The second amplifier (4) is different from the first amplifier (3) serving as the amplifier (3) and has the input terminal and the output terminal. The second amplifier (4) is connected to the third filter (transmission filter 12). The first amplifier (3) is the first power amplifier (31) that amplifies the first transmission signal. The second amplifier (4) is the second power amplifier (32) that amplifies the second transmission signal different from the first transmission signal.

The radio-frequency circuit (100*c*; 100*d*; 100*e*; 100*f*; 100*g*; 100*h*; 100*j*) according to the fourth aspect, for example, can reduce the magnitude of IMD that occurs based on two uplink carrier aggregation using the first amplifier (3) and the second amplifier (4) being performed.

The radio-frequency circuit (100*d*; 100*e*) according to a fifth aspect further includes a third balun (9) in the third or fourth aspect. The third balun (9) has a fifth coil (91) and a sixth coil (92). In the third balun (9), a first end (911) of the fifth coil (91) is connected to the output terminal of the second amplifier 4, and a second end (912) of the fifth coil (91) is connected to the ground. In the third balun (9), a first end (921) of the sixth coil (92) is connected to the first end (811) of the third coil (81) of the second balun (8) via the first switch (5), and a second end (922) of the sixth coil (92) is connected to the second end (812) of the third coil (81) of the second balun (8) via the second switch (6).

The radio-frequency circuit (100*d*; 100*e*) according to the fifth aspect can suppress the signal distortion between the third balun (9) and the second balun (8), and can suppress deterioration of the characteristics of the radio-frequency circuit (100*d*; 100*e*).

The radio-frequency circuit (100*j*) according to a sixth aspect further includes a third switch (10), a fourth switch (switch 18), a transmission filter (11C), and a controller (13) in the first or second aspect. The third switch (10) is connected to the first end (821) of the fourth coil (82) of the second balun (8). The fourth switch (switch 18) is connected between the output terminal of the amplifier (3) and the first balun (7). The transmission filter (11C) is connected between the fourth switch (switch 18) and the third switch (10) without interposing the first balun (7) and the second balun (8). The controller (13) controls the amplifier (3). The amplifier (3) is the power amplifier (31) that amplifies a transmission signal. The amplifier (3) is operable in a first power mode and a second power mode of lower output power than the first power mode. Based on the controller (13) operating the amplifier (3) in the first power mode, the fourth switch (switch 18) electrically connects the output terminal of the amplifier (3) to the first balun (7) and electrically disconnects the output terminal of the amplifier (3) from the transmission filter (11C). Based on the controller (13) operating the amplifier (3) in the second power mode, the fourth switch (switch 18) electrically disconnects the output terminal of the amplifier (3) from the first balun (7) and electrically connects the output terminal of the amplifier (3) to the transmission filter (11C).

The radio-frequency circuit (100*j*) according to the sixth aspect can suppress the signal distortion based on the amplifier (3) operating in the first power mode, and can suppress deterioration of the characteristics of the radio-frequency circuit (100*j*).

The radio-frequency circuit (100*k*) according to a seventh aspect further includes the third switch (10), the second amplifier (4), and a transmission filter (12C) in the first or second aspect. The third switch (10) is connected to the first end (821) of the fourth coil (82) of the second balun (8). The second amplifier (4) is different from the first amplifier (3) serving as the amplifier (3) and has the input terminal and the output terminal. The transmission filter (12C) is connected between the output terminal of the second amplifier (4) and the third switch (10) without interposing the first balun (7) and the second balun (8). The first amplifier (3) corresponds to a first power class. The second amplifier (4) corresponds to a second power class. The maximum output power of the first power class is greater than the maximum output power of the second power class.

The radio-frequency circuit (100*k*) according to the seventh aspect can suppress the signal distortion based on the first amplifier (3) operating, and can suppress deterioration of the characteristics of the radio-frequency circuit (100*k*).

In a radio-frequency circuit (100*m*) according to an eighth aspect, the amplifier (3) is a low noise amplifier (41) that amplifies a reception signal in the first or second aspect. The first balun (7) is connected to the input terminal of the amplifier (3).

The radio-frequency circuit (100*m*) according to the eighth aspect can suppress deterioration of the characteristics of the radio-frequency circuit (100*m*).

A radio-frequency module (500; 500*a*; 500*b*; 500*c*; 500*d*; 500*e*; 500*f*; 500*g*; 500*h*; 500*i*; 500*j*; 500*k*; 500*m*) according to a ninth aspect includes the radio-frequency circuit (100; 100*a*; 100*b*; 100*c*; 100*d*; 100*e*; 100*f*; 100*g*; 100*h*; 100*i*; 100*j*; 100*k*; 100*m*) of any one of the first to eighth aspects and a mounting substrate (501). The amplifier (3), the first switch (5), the second switch (6), the first balun (7), and the second balun (8) of the radio-frequency circuit (100; 100*a*; 100*b*; 100*c*; 100*d*; 100*e*; 100*f*; 100*g*; 100*h*; 100*i*; 100*j*; 100*k*; 100*m*) are arranged on the mounting substrate (501).

The radio-frequency module (500; 500*a*; 500*b*; 500*c*; 500*d*; 500*e*; 500*f*; 500*g*; 500*h*; 500*i*; 500*j*; 500*k*; 500*m*) according to the ninth aspect can suppress deterioration of the characteristics of the radio-frequency circuit (100; 100*a*; 100*b*; 100*c*; 100*d*; 100*e*; 100*f*; 100*g*; 100*h*; 100*i*; 100*j*; 100*k*; 100*m*).

In the radio-frequency module (500; 500*a*; 500*b*; 500*c*; 500*d*; 500*e*; 500*f*; 500*g*; 500*h*; 500*i*; 500*j*; 500*k*; 500*m*) according to a tenth aspect, the mounting substrate (501) has a first main surface (511) and a second main surface (512) facing each other in the ninth aspect. The amplifier (3) is arranged on the first main surface (511) of the mounting substrate (501). The first switch (5) and the second switch (6) are arranged on the second main surface (512) of the mounting substrate (501). The first balun (7) and the second balun (8) are arranged in the mounting substrate (501). In plan view from a thickness direction (D1) of the mounting substrate (501), at least a part of the first balun (7) overlaps the first switch (5) and the second switch (6), and at least a part of the second balun (8) overlaps the first switch (5) and the second switch (6).

The radio-frequency module (500; 500*a*; 500*b*; 500*c*; 500*d*; 500*e*; 500*f*; 500*g*; 500*h*; 500*i*; 500*j*; 500*k*; 500*m*) according to the tenth aspect can further suppress deterioration of the characteristics of the radio-frequency circuit (100; 100*a*; 100*b*; 100*c*; 100*d*; 100*e*; 100*f*; 100*g*; 100*h*; 100*i*; 100*j*; 100*k*; 100*m*).

A communication device (600) according to an eleventh aspect includes the radio-frequency circuit (100; 100*a*; 100*b*; 100*c*; 100*d*; 100*e*; 100*f*; 100*g*; 100*h*; 100*i*; 100*j*; 100*k*; 100*m*) of any one of the first to eighth aspects and a signal processing circuit (601). The signal processing circuit (601)

is connected to the radio-frequency circuit (100; 100*a*; 100*b*; 100*c*; 100*d*; 100*e*; 100*f*; 100*g*; 100*h*; 100*i*; 100*j*; 100*k*; 100*m*).

The communication device (600) according to the eleventh aspect can suppress the deterioration of the characteristics of the radio-frequency circuit (100; 100*a*; 100*b*; 100*c*; 100*d*; 100*e*; 100*f*; 100*g*; 100*h*; 100*i*; 100*j*; 100*k*; 100*m*).

REFERENCE SIGNS LIST

1 FILTER (FIRST FILTER)
1A FIRST FILTER
1B SECOND FILTER
2 SECOND FILTER
3 AMPLIFIER (FIRST AMPLIFIER)
301 TRANSISTOR
302 TRANSISTOR
303 INTERSTAGE MATCHING CIRCUIT
4 AMPLIFIER (SECOND AMPLIFIER)
5 FIRST SWITCH
50 COMMON TERMINAL
51, 52, 53 SELECTION TERMINAL
6 SECOND SWITCH
60 COMMON TERMINAL
61, 62, 63 SELECTION TERMINAL
7 FIRST BALUN
71 FIRST COIL
711 FIRST END
712 SECOND END
72 SECOND COIL
721 FIRST END
722 SECOND END
8 SECOND BALUN
81 THIRD COIL
811 FIRST END
812 SECOND END
82 FOURTH COIL
821 FIRST END
822 SECOND END
9 THIRD BALUN
91 FIFTH COIL
911 FIRST END
912 SECOND END
92 SIXTH COIL
921 FIRST END
922 SECOND END
10 THIRD SWITCH
101, 102 FIRST TERMINAL
111, 112 SECOND TERMINAL
11 TRANSMISSION FILTER (FIRST TRANSMISSION FILTER)
11A FIRST TRANSMISSION FILTER
11B SECOND TRANSMISSION FILTER
11C TRANSMISSION FILTER
12 TRANSMISSION FILTER (SECOND TRANSMISSION FILTER, THIRD FILTER)
12C TRANSMISSION FILTER
13 CONTROLLER
14 FOURTH SWITCH
140 COMMON TERMINAL
141, 142, 143 SELECTION TERMINAL
15 FIFTH SWITCH
150 COMMON TERMINAL
151, 152, 153 SELECTION TERMINAL
16 SIXTH SWITCH
161, 162 FIRST TERMINAL
165, 166 SECOND TERMINAL

17 FOURTH BALUN
171 SEVENTH COIL
1711 FIRST END
1712 SECOND END
172 EIGHTH COIL
1721 FIRST END
1722 SECOND END
18 SWITCH (FOURTH SWITCH)
180 COMMON TERMINAL
181, 182 SELECTION TERMINAL
21 RECEPTION FILTER (FIRST RECEPTION FILTER)
22 RECEPTION FILTER (SECOND RECEPTION FILTER)
31 POWER AMPLIFIER (FIRST POWER AMPLIFIER)
32 POWER AMPLIFIER (SECOND POWER AMPLIFIER)
41 LOW NOISE AMPLIFIER (FIRST LOW POWER AMPLIFIER)
42 LOW NOISE AMPLIFIER (SECOND LOW NOISE AMPLIFIER)
100, 100*a*, 100*b*, 100*c*, 100*d*, 100*e*, 100*f*, 100*g*, 100*h*, 100*i*, 100*j*, 100*k*, 100*m* RADIO-FREQUENCY CIRCUIT
500, 500*a*, 500*b*, 500*c*, 500*d*, 500*e*, 500*f*, 500*g*, 500*h*, 500*i*, 500*j*, 500*k*, 500*m* RADIO-FREQUENCY MODULE
501 MOUNTING SUBSTRATE
511 FIRST MAIN SURFACE
512 SECOND MAIN SURFACE
520 RESIN LAYER (FIRST RESIN LAYER)
521 MAIN SURFACE
523 OUTER CIRCUMFERENTIAL SURFACE
530 METAL ELECTRODE LAYER
540 SECOND RESIN LAYER
541 MAIN SURFACE
543 OUTER CIRCUMFERENTIAL SURFACE
600 COMMUNICATION DEVICE
601 SIGNAL PROCESSING CIRCUIT
602 RF SIGNAL PROCESSING CIRCUIT
603 BASEBAND SIGNAL PROCESSING CIRCUIT
A1 ANTENNA (FIRST ANTENNA)
A2 SECOND ANTENNA
Ba1 BALUN
D1 THICKNESS DIRECTION
E1 ELECTRONIC COMPONENT
E2 ELECTRONIC COMPONENT
S1 SIGNAL PATH
M1 FIRST MATCHING CIRCUIT
M11 CIRCUIT ELEMENT
M2 SECOND MATCHING CIRCUIT
M12 CIRCUIT ELEMENT
T0 EXTERNAL CONNECTION TERMINAL
T1 ANTENNA TERMINAL (FIRST ANTENNA TERMINAL)
T2 SECOND ANTENNA TERMINAL
T3 FIRST SIGNAL INPUT TERMINAL
T4 SECOND SIGNAL INPUT TERMINAL
T5 FIRST SIGNAL OUTPUT TERMINAL
T6 SECOND SIGNAL OUTPUT TERMINAL
T7 CONTROL TERMINAL
T8 GROUND TERMINAL

The invention claimed is:

1. A radio-frequency circuit comprising:

a filter;

an amplifier having an input terminal and an output terminal and connected to the filter;

a first switch;

a second switch;

a first balun having a first coil and a second coil; and a second balun having a third coil and a fourth coil, wherein in the first balun, a first end of the first coil is connected to a terminal of the input terminal and the output terminal of the amplifier that is connected to the filter, a second end of the first coil is connected to a ground, a first end of the second coil is connected to the first switch, a second end of the second coil is connected to the second switch, in the second balun, a first end of the third coil is connected to the first end of the second coil via the first switch, a second end of the third coil is connected to the second end of the second coil via the second switch, a first end of the fourth coil is connected to the filter, and a second end of the fourth coil is connected to the ground.

2. The radio-frequency circuit according to claim 1, further comprising:

a third switch connected to the first end of the fourth coil of the second balun;

a second amplifier that is different from the first amplifier serving as the amplifier and has an input terminal and an output terminal; and a transmission filter connected between the output terminal of the second amplifier and the third switch not via the first balun and the second balun, wherein the first amplifier corresponds to a first power class, the second amplifier corresponds to a second power class, and maximum output power of the first power class is greater than maximum output power of the second power class.

3. A radio-frequency circuit comprising:

a first filter having a first pass band;

a second filter having a second pass band that is the same as the first pass band;

an amplifier having an input terminal and an output terminal and connected to the first filter and the second filter;

a first switch;

a second switch;

a first balun having a first coil and a second coil; and a second balun having a third coil and a fourth coil, wherein in the first balun, a first end of the first coil is connected to a terminal of the input terminal and the output terminal of the amplifier that is connected to the first filter and the second filter, a second end of the first coil is connected to a ground, a first end of the second coil is connected to the first switch, a second end of the second coil is connected to the second switch, in the second balun, a first end of the third coil is connected to the first end of the second coil via the first filter and the first switch, a second end of the third coil is connected to the second end of the second coil via the second filter and the second switch, a first end of the fourth coil is connected to a signal path, and a second end of the fourth coil is connected to the ground.

4. The radio-frequency circuit according to claim 1, further comprising:

a third switch connected to the first end of the fourth coil of the second balun;

a fourth switch connected between the output terminal of the amplifier and the first balun;

a transmission filter connected between the fourth switch and the third switch not via the first balun and the second balun; and a controller configured to control the amplifier, wherein the amplifier is a power amplifier that amplifies a transmission signal, the amplifier is operable in a first power mode and a second power mode with lower output power than the first power mode, based on the controller operating the amplifier in the first power mode, the fourth switch electrically connects the output terminal of the amplifier and the first balun and electrically disconnect the output terminal of the amplifier from the transmission filter, and based on the controller operating the amplifier in the second power mode, the fourth switch electrically disconnects the output terminal of the amplifier from the first balun and electrically connects the output terminal of the amplifier to the transmission filter.

5. A radio-frequency module comprising:

the radio-frequency circuit according to claim 4; and a mounting substrate, wherein the amplifier, the first switch, the second switch, the first balun, and the second balun of the radio-frequency circuit are arranged on the mounting substrate.

6. The radio-frequency module according to claim 5, wherein the mounting substrate has a first main surface and a second main surface facing each other, the amplifier is arranged on the first main surface of the mounting substrate, the first switch and the second switch are arranged on the second main surface of the mounting substrate, the first balun and the second balun are arranged on the mounting substrate, in plan view from a thickness direction of the mounting substrate, at least a part of the first balun overlaps the first switch and the second switch, and at least a part of the second balun overlaps the first switch and the second switch.

7. A communication device comprising:

the radio-frequency circuit according to claim 4; and a signal processing circuit connected to the radio-frequency circuit.

8. The radio-frequency circuit according to claim 7 further comprising:

a third switch connected to the first end of the fourth coil of the second balun;

a fourth switch connected between the output terminal of the amplifier and the first balun;

a transmission filter connected between the fourth switch and the third switch not via the first balun and the second balun; and a controller configured to control the amplifier, wherein the amplifier is a power amplifier that amplifies a transmission signal, the amplifier is operable in a first power mode and a second power mode with lower output power than the first power mode, based on the controller operating the amplifier in the first power mode, the fourth switch electrically connects the output terminal of the amplifier and the first balun and electrically disconnect the output terminal of the amplifier from the transmission filter, and based on the controller operating the amplifier in the second power mode, the fourth switch electrically disconnects the output terminal of the amplifier from the first balun and electrically connects the output terminal of the amplifier to the transmission filter.

9. The radio-frequency circuit according to claim 8, further comprising a third balun having a fifth coil and a sixth coil, wherein in the third balun, a first end of the fifth coil is connected to the output terminal of the second amplifier, a second end of the fifth coil is connected to the ground, a first end of the sixth coil is connected to the first end of the third coil of the second balun via the first switch, and a second end of the sixth coil is connected to the second end of the third coil of the second balun via the second switch.

10. The radio-frequency circuit according to claim 7, further comprising:

a third switch connected to the first end of the fourth coil of the second balun;

a fourth switch connected between the output terminal of the amplifier and the first balun;

a transmission filter connected between the fourth switch and the third switch not via the first balun and the second balun; and a controller configured to control the amplifier, wherein the amplifier is a power amplifier that amplifies a transmission signal, the amplifier is operable in a first power mode and a second power mode with lower output power than the first power mode, based on the controller operating the amplifier in the first power mode, the fourth switch electrically connects the output terminal of the amplifier and the first balun and electrically disconnect the output terminal of the amplifier from the transmission filter, and based on the controller operating the amplifier in the second power mode, the fourth switch electrically disconnects the output terminal of the amplifier from the first balun and electrically connects the output terminal of the amplifier to the transmission filter.

11. The radio-frequency circuit according to claim 1, wherein the amplifier is a low noise amplifier that amplifies a reception signal, and the first balun is connected to the input terminal of the amplifier.

12. The radio-frequency circuit according to claim 1, further comprising:

a second filter different from the first filter serving as the filter; and a second amplifier that is different from the first amplifier serving as the amplifier, has an input terminal and an output terminal, and is connected to the second filter, wherein the first filter has a first pass band, the second filter has a second pass band different from the first pass band, the first amplifier is a first power amplifier that amplifies a first transmission signal, and the second amplifier is a second power amplifier that amplifiers a second transmission signal different from the first transmission signal.

13. The radio-frequency circuit according to claim 3, further comprising:

a third filter having a third pass band different from the first pass band; and a second amplifier that is different from the first amplifier serving as the amplifier, has an input terminal and an output terminal, and is connected to the third filter, wherein the first amplifier is a first power amplifier that amplifies a first transmission signal, and the second amplifier is a second power amplifier that amplifies a second transmission signal different from the first transmission signal.

14. The radio-frequency circuit according to claim 13, further comprising a third balun having a fifth coil and a sixth coil, wherein in the third balun, a first end of the fifth coil is connected to the output terminal of the second amplifier, a second end of the fifth coil is connected to the ground, a first end of the sixth coil is connected to the first end of the third coil of the second balun via the first switch, and a second end of the sixth coil is connected to the second end of the third coil of the second balun via the second switch.

15. The radio-frequency circuit according to claim 3 further comprising:

a third switch connected to the first end of the fourth coil of the second balun;

a fourth switch connected between the output terminal of the amplifier and the first balun;

a transmission filter connected between the fourth switch and the third switch not via the first balun and the second balun; and a controller configured to control the amplifier, wherein the amplifier is a power amplifier that amplifies a transmission signal, the amplifier is operable in a first power mode and a second power mode with lower output power than the first power mode, based on the controller operating the amplifier in the first power mode, the fourth switch electrically connects the output terminal of the amplifier and the first balun and electrically disconnect the output terminal of the amplifier from the transmission filter, and based on the controller operating the amplifier in the second power mode, the fourth switch electrically disconnects the output terminal of the amplifier from the first balun and electrically connects the output terminal of the amplifier to the transmission filter.

16. A radio-frequency module comprising:

the radio-frequency circuit according to claim 1; and a mounting substrate, wherein the amplifier, the first switch, the second switch, the first balun, and the second balun of the radio-frequency circuit are arranged on the mounting substrate.

17. The radio-frequency module according to claim 16, wherein the mounting substrate has a first main surface and a second main surface facing each other, the amplifier is arranged on the first main surface of the mounting substrate, the first switch and the second switch are arranged on the second main surface of the mounting substrate, the first balun and the second balun are arranged on the mounting substrate, in plan view from a thickness direction of the mounting substrate, at least a part of the first balun overlaps the first switch and the second switch, and at least a part of the second balun overlaps the first switch and the second switch.

18. A communication device comprising:

the radio-frequency circuit according to claim 1; and a signal processing circuit connected to the radio-frequency circuit.

19. A radio-frequency module comprising:
the radio-frequency circuit according to claim 3; and
a mounting substrate,
wherein the amplifier, the first switch, the second switch, the first balun, and the second balun of the radio-frequency circuit are arranged on the mounting substrate.

20. The radio-frequency module according to claim 19,
wherein the mounting substrate has a first main surface and a second main surface facing each other,
the amplifier is arranged on the first main surface of the mounting substrate,
the first switch and the second switch are arranged on the second main surface of the mounting substrate,
the first balun and the second balun are arranged on the mounting substrate,
in plan view from a thickness direction of the mounting substrate,
at least a part of the first balun overlaps the first switch and the second switch, and
at least a part of the second balun overlaps the first switch and the second switch.

\*  \*  \*  \*  \*